(12) United States Patent
Yang et al.

(10) Patent No.: US 11,990,189 B2
(45) Date of Patent: May 21, 2024

(54) NONVOLATILE MEMORY DEVICE AND PROGRAMMING METHOD OF NONVOLATILE MEMORY

(71) Applicant: SAMSUNG ELECTRONICS CO., LTD., Suwon-si (KR)

(72) Inventors: Younghwi Yang, Yongin-si (KR); Joonsuc Jang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 152 days.

(21) Appl. No.: 17/839,253

(22) Filed: Jun. 13, 2022

(65) Prior Publication Data

US 2023/0207026 A1  Jun. 29, 2023

(30) Foreign Application Priority Data

Dec. 27, 2021 (KR) .................. 10-2021-0187983

(51) Int. Cl.
  *G11C 16/34* (2006.01)
  *G11C 16/04* (2006.01)
  *G11C 16/08* (2006.01)
  *G11C 16/10* (2006.01)
  *H01L 23/00* (2006.01)
  (Continued)

(52) U.S. Cl.
  CPC ...... *G11C 16/3427* (2013.01); *G11C 16/0483* (2013.01); *G11C 16/08* (2013.01); *G11C 16/10* (2013.01); *H01L 24/08* (2013.01); *H01L 25/0657* (2013.01); *H01L 25/18* (2013.01);
  (Continued)

(58) Field of Classification Search
  CPC .......... G11C 16/3427; G11C 16/0483; G11C 16/08; G11C 16/10; G11C 2211/5621; G11C 11/5628; G11C 16/30; G11C 16/3459; G11C 16/34; G11C 16/3418; H01L 24/08; H01L 25/0657; H01L 25/18; H01L 2224/08145; H01L 2924/1431; H01L 2924/14511; H10B 41/27; H10B 43/27

See application file for complete search history.

(56) References Cited

U.S. PATENT DOCUMENTS 8,385,131 B2  2/2013 Seol
10,283,202 B1  5/2019 Chen et al.
(Continued)

OTHER PUBLICATIONS

European Search Reported dated Dec. 12, 2022 From European Patent Office for European Patent Application No. 22181529.3.

*Primary Examiner* — Hien N Nguyen
(74) *Attorney, Agent, or Firm* — Fish & Richardson P.C.

(57) ABSTRACT

A nonvolatile memory device includes at least one memory block and a control circuit. The at least one memory block includes a plurality of cell strings that are divided into a plurality of stacks disposed in the vertical direction, and each of the plurality of stacks includes at least one dummy word-line. The control circuit controls a program operation by applying a program voltage to a selected word-line of the plurality of cell strings during a program execution period and by reducing a voltage level of a dummy voltage applied to the at least one dummy word-line of at least one upper stack from among the plurality of stacks during the program execution period. The at least one upper stack is disposed at a higher position than a selected stack in the vertical direction and the selected stack from among the plurality of stacks includes the selected word-line.

20 Claims, 34 Drawing Sheets

US 11,990,189 B2

Page 2

(51) Int. Cl.
*H01L 25/065* (2023.01)
*H01L 25/18* (2023.01)

(52) U.S. Cl.
CPC ............... *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 10,957,409 B1 | 3/2021 | Jia et al. | |
| 11,062,759 B1 | 7/2021 | Ku et al. | |
| 11,062,782 B2 | 7/2021 | Wang et al. | |
| 2012/0300546 A1* | 11/2012 | Tessariol | G11C 16/10 257/314 |
| 2014/0112074 A1* | 4/2014 | Rhie | G11C 16/14 365/185.11 |
| 2015/0092494 A1* | 4/2015 | Rhie | G11C 16/16 365/185.11 |
| 2019/0189218 A1 | 6/2019 | Izumi et al. | |
| 2019/0198117 A1 | 6/2019 | Yu et al. | |
| 2020/0143890 A1 | 5/2020 | Lee | |
| 2020/0319953 A1* | 10/2020 | Kim | G06F 12/0882 |
| 2020/0402584 A1* | 12/2020 | Lee | G11C 16/20 |
| 2021/0280251 A1 | 9/2021 | Lee | |
| 2022/0115073 A1* | 4/2022 | Park | G11C 16/08 |
| 2023/0018305 A1* | 1/2023 | Kim | G11C 16/08 |
| 2023/0207026 A1* | 6/2023 | Yang | G11C 16/08 365/185.02 |

* cited by examiner

FIG. 19

ST1 PROGRAM

| STRING | | PPC | PBST | PGME | | PGMRC |
|---|---|---|---|---|---|---|
| | BL | VINH OR VPER | | | | VPER |
| SSL — SST | | VSOFF | VSON | VSON | | VSOFF |
| | MC12 | ↑ | ↑ | ↑ | | ↑ |
| | MC11 | | | | | |
| ST3 { | MC10 | Vo | Vo | VPASS1 | VPASS2 | Vo |
| | MC9 | ↓ | ↓ | ↓ | ↓ | ↓ |
| DWL2 — DMC2 | | VDON | VOFF | VDUM1 | VDUM2 | VOFF |
| | MC8 | ↑ | ↑ | ↑ | | ↑ |
| | MC7 | | | | | |
| ST2 { | MC6 | Vo | Vo | VPASS1 | VPASS2 | Vo |
| | MC5 | ↓ | ↓ | ↓ | ↓ | ↓ |
| DWL1 — DMC1 | | VDON | VOFF | VDUM1 | VDUM2 | VOFF |
| | MC4 | Vo | Vo | VPASS1 | | Vo |
| ST1 { | MC3 | Vo | VPASS1 | VPGM | | Vo |
| | MC2 | Vo | Vo | VPASS1 | | Vo |
| | MC1 | Vo | Vo | VPASS1 | | Vo |
| GSL — GST | | VGON | VGOFF | VGOFF | | VGOFF |
| | CSL | VPC | VPC | VPC | | VSS |

FIG. 21

ST2 PROGRAM

| STRING | | PPC | PBST | PGME | | PGMRC |
|---|---|---|---|---|---|---|
| | BL | VINH OR VPER | | | | VPER |
| SSL | SST | VSOFF | VSON | VSON | | VSOFF |
| ST3 | MC12 | ↑ | ↑ | ↑ | | ↑ |
| | MC11 | | | | | |
| | MC10 | Vo | Vo | VPASS1 | VPASS2 | Vo |
| | MC9 | ↓ | ↓ | ↓ | | ↓ |
| DWL2 | DMC2 | VDON | VOFF | VDUM1 | VDUM2 | VOFF |
| ST2 | MC8 | Vo | Vo | VPASS1 | | Vo |
| | MC7 | Vo | VPASS1 | VPGM | | Vo |
| | MC6 | Vo | Vo | VPASS1 | | Vo |
| | MC5 | Vo | Vo | VPASS1 | | Vo |
| DWL1 | DMC1 | VDON | VOFF | VDUM1 | | VOFF |
| ST1 | MC4 | ↑ | ↑ | ↑ | | ↑ |
| | MC3 | Vo | Vo | VPASS1 | | Vo |
| | MC2 | | | | | |
| | MC1 | ↓ | ↓ | ↓ | | ↓ |
| GSL | GST | VGON | VGOFF | VGOFF | | VGOFF |
| | CSL | VPC | VPC | VPC | | VSS |

FIG. 23

ST1 PROGRAM

| STRING | | PPC | PBST | PGME | | PGMRC |
|---|---|---|---|---|---|---|
| | BL | \multicolumn{4}{c|}{VINH OR VPER} | VPER |
| SSL — SST | | VSOFF | VSON | VSON | | VSOFF |
| ST3 { MC12 | | ↑ | ↑ | ↑ | ↑ | ↑ |
| MC11 | | | | | | |
| MC10 | | Vo | Vo | VPASS1 | VPASS2 | Vo |
| MC9 | | ↓ | ↓ | VPASS1 | VPASS3 | ↓ |
| DWL2 — DMC2 | | VDON | VOFF | VDUM1 | VDUM2 | VOFF |
| ST2 { MC8 | | ↑ | ↑ | ↑ | ↑ | ↑ |
| MC7 | | | | | | |
| MC6 | | Vo | Vo | VPASS1 | VPASS2 | Vo |
| MC5 | | ↓ | ↓ | VPASS1 | VPASS3 | ↓ |
| DWL1 — DMC1 | | VDON | VOFF | VDUM1 | VDUM2 | VOFF |
| ST1 { MC4 | | Vo | Vo | VPASS1 | | Vo |
| MC3 | | Vo | VPASS1 | VPGM | | Vo |
| MC2 | | Vo | Vo | VPASS1 | | Vo |
| MC1 | | Vo | Vo | VPASS1 | | Vo |
| GSL — GST | | VGON | VGOFF | VGOFF | | VGOFF |
| | CSL | VPC | VPC | VPC | | VSS |

VPASS1 > VPASS2 > VPASS3

FIG. 25

ST2 PROGRAM

| STRING | | PPC | PBST | PGME | | PGMRC |
|---|---|---|---|---|---|---|
| | BL | VINH OR VPER | | | | VPER |
| SSL — SST | | VSOFF | VSON | VSON | | VSOFF |
| ST3 { | MC12 | ↑ | ↑ | ↑ | ↑ | ↑ |
| | MC11 | | | | | |
| | MC10 | Vo | Vo | VPASS1 | VPASS2 | Vo |
| | MC9 | ↓ | ↓ | VPASS1 | VPASS3 | ↓ |
| DWL2 — DMC2 | | VDON | VOFF | VDUM1 | VDUM2 | VOFF |
| ST2 { | MC8 | Vo | Vo | VPASS1 | | Vo |
| | MC7 | Vo | VPASS1 | VPGM | | Vo |
| | MC6 | Vo | Vo | VPASS1 | | Vo |
| | MC5 | Vo | Vo | VPASS1 | | Vo |
| DWL1 — DMC1 | | VODN | VOFF | VDUM1 | | VOFF |
| ST1 { | MC4 | ↑ | ↑ | ↑ | | ↑ |
| | MC3 | Vo | Vo | VPASS1 | | Vo |
| | MC2 | | | | | |
| | MC1 | ↓ | ↓ | ↓ | | ↓ |
| GSL — GST | | VGON | VGOFF | VGOFF | | VGOFF |
| | CSL | VPC | VPC | VPC | | VSS |

VPASS1 > VPASS2 > VPASS3

VPASS1 > VPASS2 > VPASS3

FIG. 28

ST1 PROGRAM

| STRING | | PPC | PBST | PGME | | PGMRC |
|---|---|---|---|---|---|---|
| BL | | VINH OR VPER | | | | VPER |
| SSL — SST | | VSOFF | VSON | VSON | | VSOFF |
| SB3 { MC12 | | | | | | |
| MC11 | | | | | | |
| MC10 | | Vo | Vo | VPASS1 | VPASS2 | Vo |
| BWL2 — MC9 | | VBON | VOFF | VDUM1 | VDUM2 | VOFF |
| SB2 { MC8 | | | | | | |
| MC7 | | | | | | |
| MC6 | | Vo | Vo | VPASS1 | VPASS2 | Vo |
| BWL1 — MC5 | | VBON | VOFF | VDUM1 | VDUM2 | VOFF |
| SB1 { MC4 | | Vo | Vo | VPASS1 | | Vo |
| MC3 | | Vo | VPASS1 | VPGM | | Vo |
| MC2 | | Vo | Vo | VPASS1 | | Vo |
| MC1 | | Vo | Vo | VPASS1 | | Vo |
| GSL — GST | | VGON | VGOFF | VGOFF | | VGOFF |
| CSL | | VPC | VPC | VPC | | VSS |

FIG. 29

ST2 PROGRAM

| STRING | | PPC | PBST | PGME | | PGMRC |
|---|---|---|---|---|---|---|
| | BL | VINH OR VPER | | | | VPER |
| SSL — SST | | VSOFF | VSON | VSON | | VSOFF |
| SB3 { MC12 | | | | | | |
| MC11 | | | | | | |
| MC10 | | Vo | Vo | VPASS1 | VPASS2 | Vo |
| BWL2 — MC9 | | VBON | VOFF | VDUM1 | VDUM2 | VOFF |
| SB2 { MC8 | | Vo | Vo | VPASS1 | | Vo |
| MC7 | | Vo | VPASS1 | VPGM | | Vo |
| MC6 | | Vo | Vo | VPASS1 | | Vo |
| BWL1 — MC5 | | VBON | VOFF | VDUM1 | | VOFF |
| SB1 { MC4 | | | | | | |
| MC3 | | Vo | Vo | VPASS1 | | Vo |
| MC2 | | | | | | |
| MC1 | | | | | | |
| GSL — GST | | VGON | VGOFF | VGOFF | | VGOFF |
| | CSL | VPC | VPC | VPC | | VSS |

NONVOLATILE MEMORY DEVICE AND PROGRAMMING METHOD OF NONVOLATILE MEMORY

CROSS-REFERENCE TO RELATED APPLICATION

This US application claims priority under 35 USC § 119 to Korean Patent Application No. 10-2021-0187983, filed on Dec. 27, 2021, in the Korean Intellectual Property Office (KIPO), the disclosure of which is incorporated by reference in its entirety herein.

BACKGROUND

1. Technical Field

Example embodiments generally relate to semiconductor memory devices and, more particularly, to a nonvolatile memory device and a programming method of a nonvolatile memory device.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of a three-dimensional structure, such as vertical NAND memory devices, have been developed to increase integration degree and memory capacity of the nonvolatile memory devices. Along with increases in the integration degree and memory capacity, disturbance on unselected memory cells increases while selected memory cells are programmed.

SUMMARY

Some example embodiments may provide a nonvolatile memory device capable of reducing pass disturbance.

Some example embodiments may provide a programming method of a nonvolatile memory device capable of reducing pass disturbance.

According to example embodiments, a nonvolatile memory device includes at least one memory block and a control circuit. The at least one memory block includes a plurality of cell strings where each of the plurality of cell strings includes a string selection transistor, a plurality of memory cells and a ground selection transistor which are connected in series and disposed in a vertical direction between a source line and a bit-line. The plurality of cell strings are divided into a plurality of stacks disposed in the vertical direction, and each of the plurality of stacks includes at least one dummy word-line adjacent to a boundary between the plurality of stacks. The control circuit controls a program operation by applying a program voltage to a selected word-line of the plurality of cell strings during a program execution period and by reducing a voltage level of a dummy voltage applied to the at least one dummy word-line of at least one upper stack from among the plurality of stacks during the program execution period. The at least one upper stack is disposed at a higher position than a selected stack in the vertical direction, and the selected stack from among the plurality of stacks includes the selected word-line.

According to example embodiments, there is provided a programming method of a nonvolatile memory device. According to the programming method, at least one memory block includes a plurality of cell strings and the plurality of cell strings are divided into a plurality of stacks disposed in a vertical direction. Each of the plurality of cell strings includes a string selection transistor, a plurality of memory cells, and a ground selection transistor which are connected in series and disposed in the vertical direction between a source line and a bit-line. Each of the plurality of stacks includes at least one dummy word-line adjacent to a boundary between the plurality of stacks. A program voltage is applied to a selected word-line of the plurality of cell strings during a program execution period, and a voltage level of a dummy voltage applied to the at least one dummy word-line of at least one upper stack from among the plurality of stacks is reduced during the program execution period. The at least one upper stack is disposed at a higher position than a selected stack in the vertical direction, and the selected stack from among the plurality of stacks includes the selected word-line.

According to example embodiments, a nonvolatile memory device includes at least one memory block and a control circuit. The at least one memory block includes a plurality of cell strings where each of the plurality of cell strings includes a string selection transistor, a plurality of memory cells, and a ground selection transistor which are connected in series and disposed in a vertical direction between a source line and a bit-line. The plurality of cell strings are divided into a plurality of sub-blocks disposed in the vertical direction, and each of the plurality of sub-blocks includes at least one boundary word-line adjacent to another sub-block and internal word-lines except the at least one boundary word-line. The control circuit controls a program operation by applying a program voltage to a selected word-line of the plurality of cell strings during a program execution period and by reducing a voltage level of a dummy voltage applied to the at least one boundary word-line of at least one upper sub-block from among the plurality of sub-blocks during the program execution period. The at least one upper sub-block is disposed at a higher position than a selected sub-block in the vertical direction, and the selected sub-block from among the plurality of sub-blocks includes the selected word-line.

Accordingly, the nonvolatile memory device may turn off dummy memory cells coupled to a dummy word-line of an upper stack disposed at a higher position than a selected stack by applying a reduced dummy voltage to the dummy word-line, and thus, may block program disturbance, which the word-lines of the upper stack may receive from the selected stack.

BRIEF DESCRIPTION OF THE DRAWINGS

Illustrative, non-limiting example embodiments will be more clearly understood from the following detailed description in conjunction with the accompanying drawings.

FIG. 19 illustrates an example of programming the memory block of FIG. 18.

FIG. 21 illustrates an example of programming the memory block of FIG. 18.

FIG. 23 illustrates an example of programming the memory block of FIG. 18.

FIG. 25 illustrates an example of programming the memory block of FIG. 18.

FIG. 28 illustrates an example of programming the memory block of FIG. 27 according to example embodiments.

FIG. 29 illustrates an example of programming the memory block of FIG. 27 according to example embodiments.

DETAILED DESCRIPTION OF THE EMBODIMENTS

Various example embodiments will be described more fully hereinafter with reference to the accompanying drawings, in which some example embodiments are shown.

Figure 1:
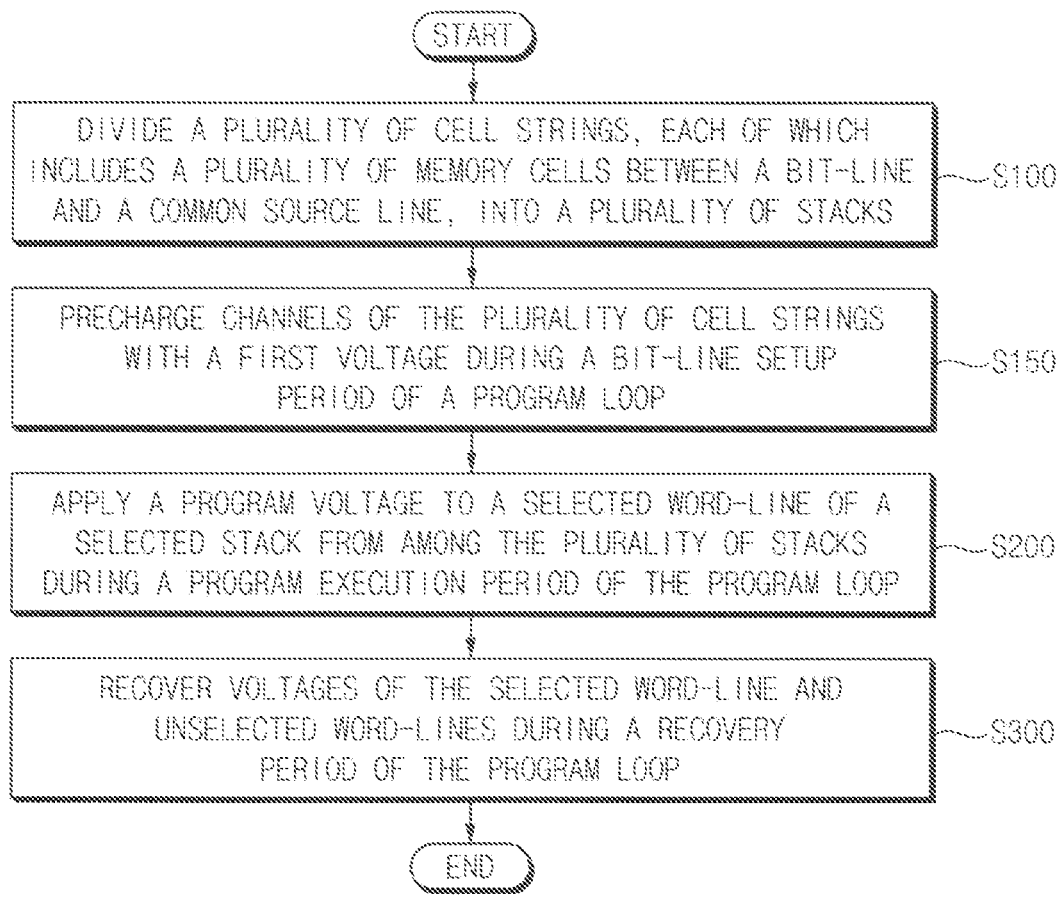
FIG. 1 is a flow chart illustrating a method of programming a nonvolatile memory device according to example embodiments.

FIG. 1 is a flow chart illustrating a method of programming of a nonvolatile memory device according to example embodiments.

FIG. 1 illustrates a method of programming in a nonvolatile memory device including at least one memory block which includes a plurality of cell strings, where each cell string includes a string selection transistor, a plurality of memory cells, and a ground selection transistor connected between a bit line and a source line. According to example embodiments, the nonvolatile memory device may include a three-dimensional NAND flash memory device or a vertical NAND flash memory device.

Referring to FIG. 1, the at least one memory block including the plurality of cell strings is divided into a plurality of stacks (operation S100). Each of the plurality of stacks may include at least one dummy word-line that is disposed at or adjacent to a boundary between the plurality of stacks.

Channels of the plurality of cell strings are precharged to a first voltage during a bit-line set-up period of a program loop (operation S150).

In general, the channels of the cell strings may be precharged through string selection transistors by a set-up voltage of a bit line during a bit-line set-up period. However, in case of programming the memory cells earlier as the memory cells are located at an upper position for reducing program disturbance, the channels cannot be precharged or initialized through the string selection transistors if any memory cell above the selected memory cell has been programmed from an erased state to a programmed state. Accordingly, the channels of the cell strings may be precharged through the ground selection transistors when the memory cells are programmed earlier as the memory cells are located at an upper position.

The three-dimensional NAND flash memory device is more vulnerable to a program disturbance as the size or the critical dimension (CD) of the channel hole is decreased. In case of a multiple level cell (MLC), the number of bits programmed in each cell is increased. The number of program loops is increased due to the increased number of programmed states and thus the performance degradation due to the program disturbance is increased. Accordingly the program operation may be performed along the direction of a size decrease of the channel hole as will be described below. When the program operation is performed along the direction of the size decrease of the channel hole, a bias voltage may be applied to a ground selection line and an unselect string initial precharge (USIP) may be performed using a voltage of a source line.

A program voltage is applied to a selected word-line of the plurality of cell strings during a program execution period of the program loop and a voltage level of a dummy voltage applied to the at least one dummy word-line of at least one upper stack from among the plurality of stacks is reduced (operation S200). The at least one upper stack is disposed at a higher position than a selected stack in the vertical direction and the selected stack from among the plurality of stacks includes the selected word-line.

Voltages of the selected word-line and unselected word-lines of the plurality of cell strings are recovered during a program recovery period of the program loop (operation S300).

After recovering voltages of the selected word-line and unselected word-lines of the plurality of cell strings to a negative voltage smaller than a ground voltage, the voltages of the selected word-lines and the unselected word-lines may be recovered to a second voltage greater than the ground voltage during a recovery period of the program loop. When the voltages of the selected word-lines and the unselected word-lines are recovered to the second voltage after recovering the voltages of the selected word-line and the unselected word-lines, the voltages of the selected word-line and the unselected word-lines may be stably recovered to a voltage before being precharged during a verification read period successive to the program recovery period. In this case, soft erase and hot carrier injection which may occur in the unselected word-lines may be prevented.

Figure 2:
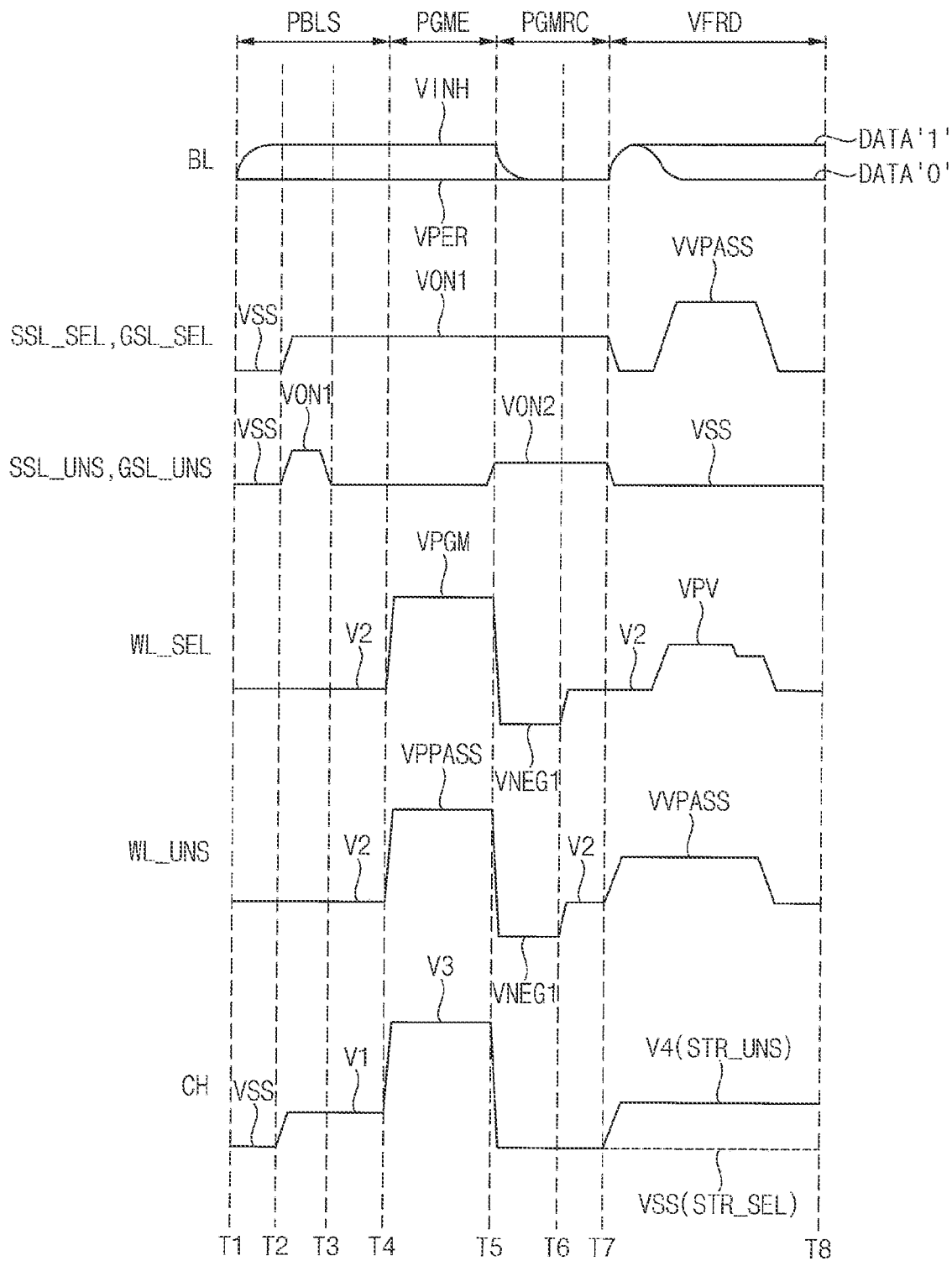
FIG. 2 is a timing diagram illustrating a method of programming a nonvolatile memory device according to example embodiments.

FIG. 2 is a timing diagram illustrating a method of programming in a nonvolatile memory device according to example embodiments.

FIG. 2 illustrates a bit-line set-up period PBLS, a program execution period PGME, a program recovery period PGMRC, and a verification read period VFRD of one of a plurality of program loops. Time points T1~T8 represent boundaries of the periods.

Referring to FIG. 2, during the bit-line set-up period PBLS, a ground voltage VSS is applied to a string selection line SSL_SEL and a ground selection line GSL_SEL of a selected cell string from the time point T1 to the time point T2 and a first turn-on voltage VON1 is applied to the string selection line SSL_SEL and the ground selection line GSL_SEL of the selected string from the time point T2 to the time point T4. The ground voltage VSS is applied to a string selection line SSL_UNS and a ground selection line GSL_UNS of an unselected cell string from the time point T1 to the time point T2, the first turn-on voltage VON1 is applied to the string selection line SSL_UNS and the ground selection line GSL_UNS of the unselected cell string from the time point T2 to the time point T3, and the ground voltage VSS is applied to the string selection line SSL_UNS and the ground selection line GSL_UNS of the unselected cell string from the time point T3 to the time point T4. In example embodiments, levels of voltages applied to the string selection line SSL_UNS and the ground selection line GSL_UNS of the unselected cell string may be varied according to a position of the unselected cell string.

A second voltage V2 greater than the ground voltage VSS is applied to a selected word-line WL_SEL and an unselected word-line WL_ULS from the time point T1 to the time point T4. Accordingly, a channel of each of the cell strings is precharged from the ground voltage VSS to the first voltage V1. That is, a channel of each of the cell strings is precharged to the first voltage V1 by performing an unselect string initial precharge (USIP).

The USIP may be performed by using a gate induced drain leakage (GIDL). As understood from the name itself, the GIDL indicates a phenomenon in which a leakage occurs at a drain of a transistor by a gate of the transistor. For example, when 0V or a negative voltage level is applied to the gate and a sufficiently high positive voltage is applied to the drain, severe band bending may be induced in the oxide near the drain and thus band-to-band tunneling from the valence band of the silicon surface to the conduction band of the silicon body may occur.

Tunneling electrons are attracted to the drain and the drain current increases. Usually the semiconductor substrate is biased by a ground voltage, and holes are attracted to the semiconductor substrate of a relatively low voltage. The gate voltage of a negative voltage level is used to turn off the transistor, but the transistor operates as if it is turned on because the drain current of the GIDL current increases due to the GIDL phenomenon. The GIDL current increases as the gate voltage is decreased and/or the drain voltage is increased.

The channels of each of the cell strings may be precharged by using the GIDL. For generating the GIDL phenomenon, a string selection transistor of a cell string, a ground selection transistor of a cell string, or a GIDL transistor may be used, which will be described with reference to FIGS. 8B through 8D.

A program inhibit voltage VINH or a program permission voltage VPER is applied to a bit-line BL based on a value of write data at a starting point T1 of the bit-line set-up period PBLS.

During the program execution period PGME between the time point T4 and the time point T5, successive to the bit-line set-up period PBLS, the first turn-on voltage VON1 is applied to string selection line SSL_SEL and the ground selection line GSL_SEL of the selected string, a program voltage VPGM is applied to the selected word-line WL_SEL and a program pass voltage VPPASS is applied to the unselected word-line WL_UNS. Accordingly, voltage level of the channel CH of each of the cell strings is increased to a third voltage V3. During the program execution period PGME, the level of the bit-line BL is maintained at the program inhibit voltage VINH or the program permission voltage VPER based on the value of the write data.

During the program recovery period PGMRC between the time point T5 and the time point T7, successive to the program execution period PGME, the first turn-on voltage VON1 is applied to the string selection line SSL_SEL and the ground selection line GSL_SEL of the selected string and a second turn-on voltage VON2 smaller than the first turn-on voltage VON1 is applied to the string selection line SSL_UNS and the ground selection line GSL_UNS of the unselected cell string. Accordingly, a voltage level of the channel CH of each of the cell strings is increased to a third voltage V3. In addition, after a first negative voltage VNEG1 is applied to the selected word-line WL_SEL and the unselected word-line WL_UNS from the time point T5 and to the time point T6, the second voltage V2 is applied to the selected word-line WL_SEL and the unselected word-line WL_UNS from the time point T6 and to the time point T7. The selected word-line WL_SEL and the unselected word-line WL_UNS are recovered to the second voltage V2 after the selected word-line WL_SEL and the unselected word-line WL_UNS are recovered to the first negative voltage VNEG1. Because the first turn-on voltage VON1 is applied to the string selection line SSL_SEL and the ground selection line GSL_SEL of the selected string and the second turn-on voltage VON2 is applied to string selection line SSL_UNS and the ground selection line GSL_UNS of the unselected cell string, the selected cell string and the unselected cell string are open and thus the voltage level of the channel CH of each of the cell strings is lowered to a voltage level around the ground voltage VSS and is maintained. The voltage level of the bit-line BL converges to the program permission voltage VPER during the program recovery period PGMRC.

During the verification read period VFRD between the time point T7 and the time point T8, successive to the recovery period PGMRC, a verification pass voltage VVPASS is applied to string selection line SSL_SEL and the ground selection line GSL_SEL of the selected string and the ground voltage VSS is applied to the string selection line SSL_UNS and the ground selection line GSL_UNS of the unselected cell string. In addition, a verification read voltage VPV is applied to the selected word-line WL_SEL and the verification pass voltage VVPASS is applied to the unselected word-line WL_UNS. Therefore, a voltage level of the channel of the selected cell string STR_SEL is maintained at a voltage level around the ground voltage VSS and a voltage level of the channel of the unselected cell string STR_UNS is increased to a fourth voltage V4. The fourth voltage V4 may be smaller than the third voltage V3 and may be greater than the first voltage V1. Therefore, the soft erase which may occur in the unselected cell string STR_UNS and the hot carrier injection which may occur at an edge of the selected cell string STR_SEL may be prevented.

Assume that a voltage level (i.e., a potential) of the channel, which is not lowered during the program recovery period PGMRC, has a first level corresponding to a precharged voltage. During the verification read period VFRD, when the verification read voltage VPV is applied to the selected word-line WL_SEL and the verification pass voltage VVPASS is applied to the unselected word-line WL_UNS, a voltage level of the unselected cell string has a high level corresponding to the first level and the level of the verification pass voltage. Accordingly, the soft erase may occur in memory cells of the unselected cell string due to high voltage level of the channel of the unselected cell string. In addition, since a voltage level of the channel of the selected cell string rapidly changes from the first level to the level of the ground voltage VSS, leakage current is HCl-injected to a string selection transistor or a ground selection transistor of the selected cell string due to rapid change of the channel and a threshold voltage of the string selection transistor or the ground selection transistor may increase.

Even though not illustrated in FIG. 2, during a bit-line precharge period before the verification read period VFRD, all of the bit-lines may be initialized by the same bit-line precharge voltage. A voltage of a bit-line is developed to a voltage corresponding to '1' or '0' depending on the threshold voltage state of the selected memory cell during the verification read period VFRD. The data stored in the selected memory cell may be determined by sensing the voltage development of the bit-line.

Figure 3:
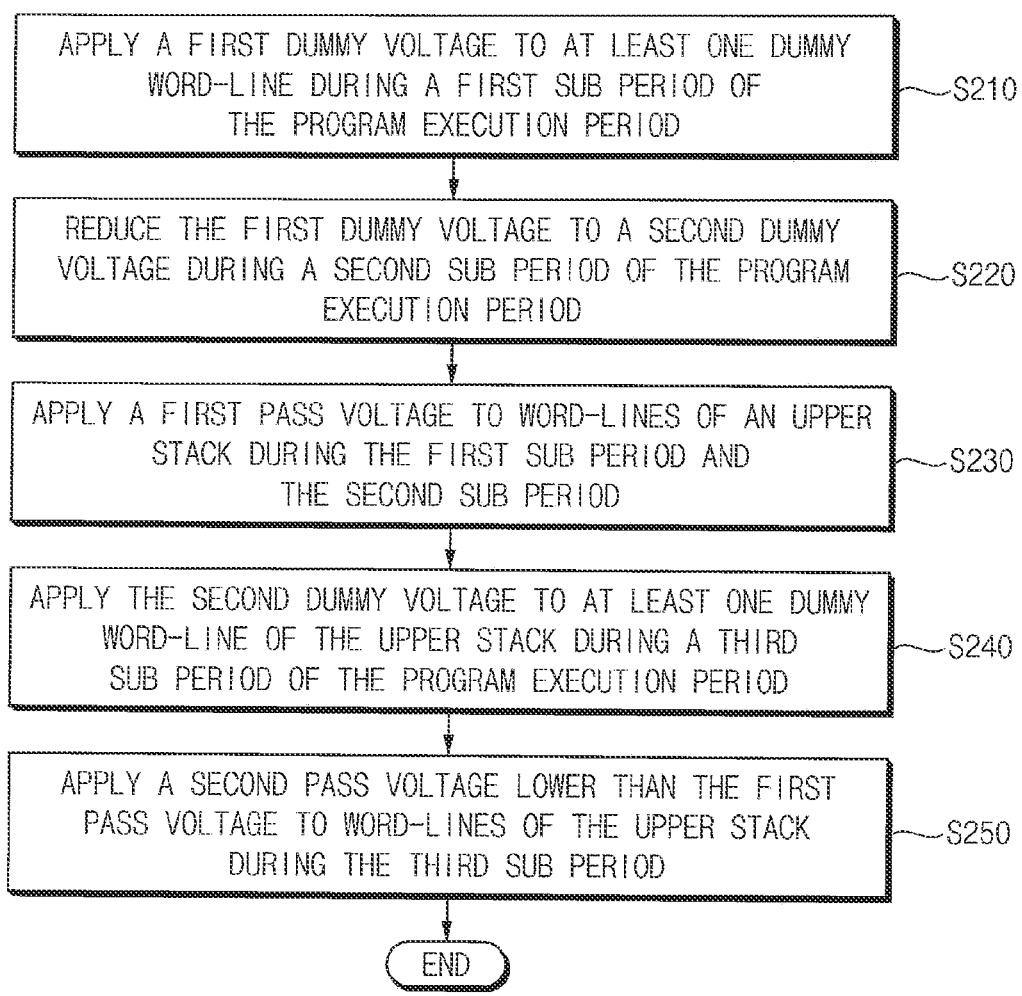
FIG. 3 is a flow chart illustrating an operation of reducing a voltage level of a dummy voltage during the program execution period.
Figure 4:
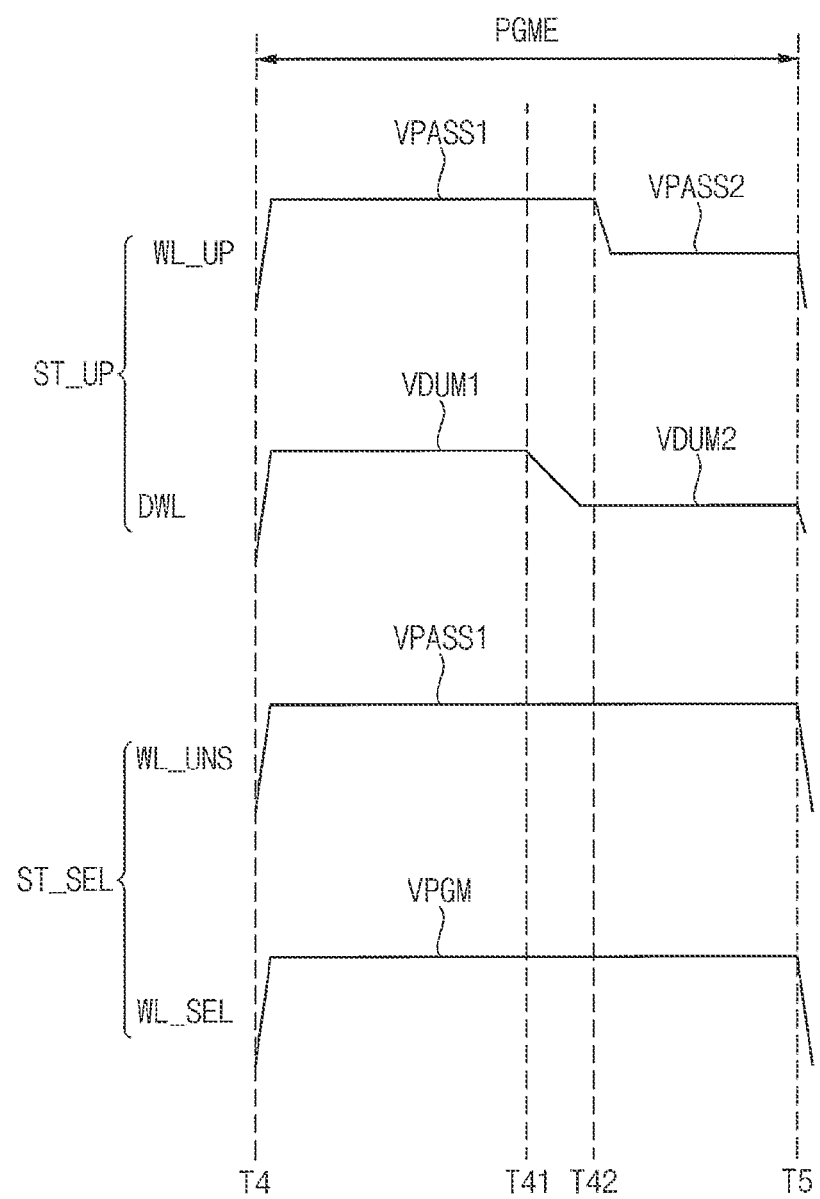
FIG. 4 is a timing diagram illustrating a method of FIG. 3, according to example embodiments.

FIG. 3 is a flow chart illustrating an operation of reducing a voltage level of a dummy voltage during the program execution period and FIG. 4 is a timing diagram illustrating a method of FIG. 3, according to example embodiments.

Referring to FIGS. 3 and 4, for reducing the voltage level of the dummy voltage (operation S200), a first dummy voltage VDUM1 is applied to at least one dummy word-line DWL of at least one upper stack ST_UP during a first sub period T4~T41 of the program execution period PGME (operation S210). A program forcing voltage may be applied to the bit-line BL during the first sub period T4~T41 and the program forcing voltage arrives at a channel of a selected stack ST_SEL.

The first dummy voltage VDUM1 is reduced to a second dummy voltage VDUM2 during a second sub period T41~T42 of the program execution period PGME (operation S220). A first pass voltage VPASS1 is applied to word-lines WL_UP of the at least one upper stack ST_UP during the first sub period T4~T41 and the second sub period T41~T42 (operation S230).

The second dummy voltage VDUM2 is applied to the at least one dummy word-line DWL of the least one upper stack ST_UP during a third sub period T42~T5 of the program execution period PGME (operation S240). A second pass voltage VPASS2 smaller than the first pass voltage VPASS1 is applied to word-lines WL_UP of the at least one upper stack ST_UP during the third sub period T42~T5 (operation S250).

The program voltage VPGM is applied to a selected word-line WL_SEL of the selected stack ST_SEL during the program execution period PGME.

Therefore, dummy memory cells are turned off by applying the second dummy voltage VDUM2 to the at least one dummy word-line DWL during the third sub period T42~T5, and thus program disturbance, which the word-lines WL_UP of the at least one upper stack ST_UP may receive from the selected stack may be cut off (blocked).

The first sub period T4~T41, the second sub period T41~T42, and the third sub period T42~T5 may be successive.

Figure 5:
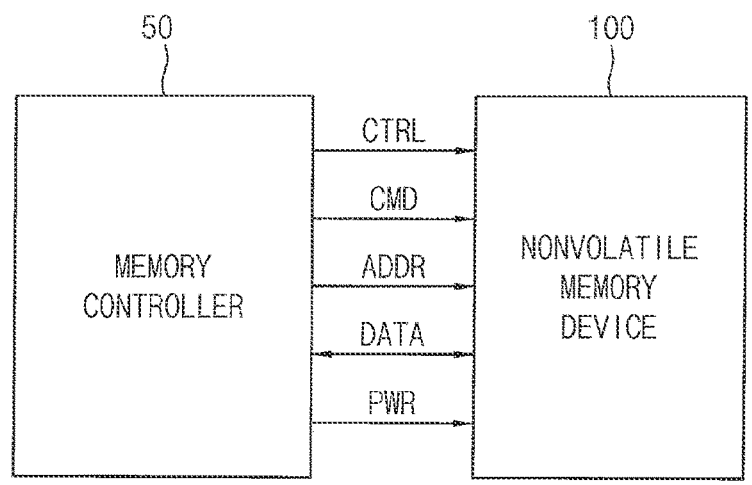
FIG. 5 is a block diagram illustrating a storage device according to example embodiments.

FIG. 5 is a block diagram illustrating a storage device according to example embodiments.

Referring to FIG. 5, a storage device (i.e., a memory system) 10 may include a memory controller 50 and at least one nonvolatile memory device 100.

In example embodiments, each of the memory controller 50 and the nonvolatile memory device 100 may be provided with the form of a chip, a package, or a module. Alternatively, the memory controller 50 and the nonvolatile memory device 100 may be packaged into one of various packages.

The nonvolatile memory device 100 may perform an erase operation, a program operation, or a write operation under control of the memory controller 50. The nonvolatile memory device 100 receives a command CMD, an address ADDR and data DATA through input/output lines from the memory controller 50 for performing such operations. In addition, the nonvolatile memory device 100 receives a control signal CTRL through a control line from the memory controller 50. In addition, the nonvolatile memory device 100 receives a power PWR through a power line from the memory controller 50.

Figure 6:
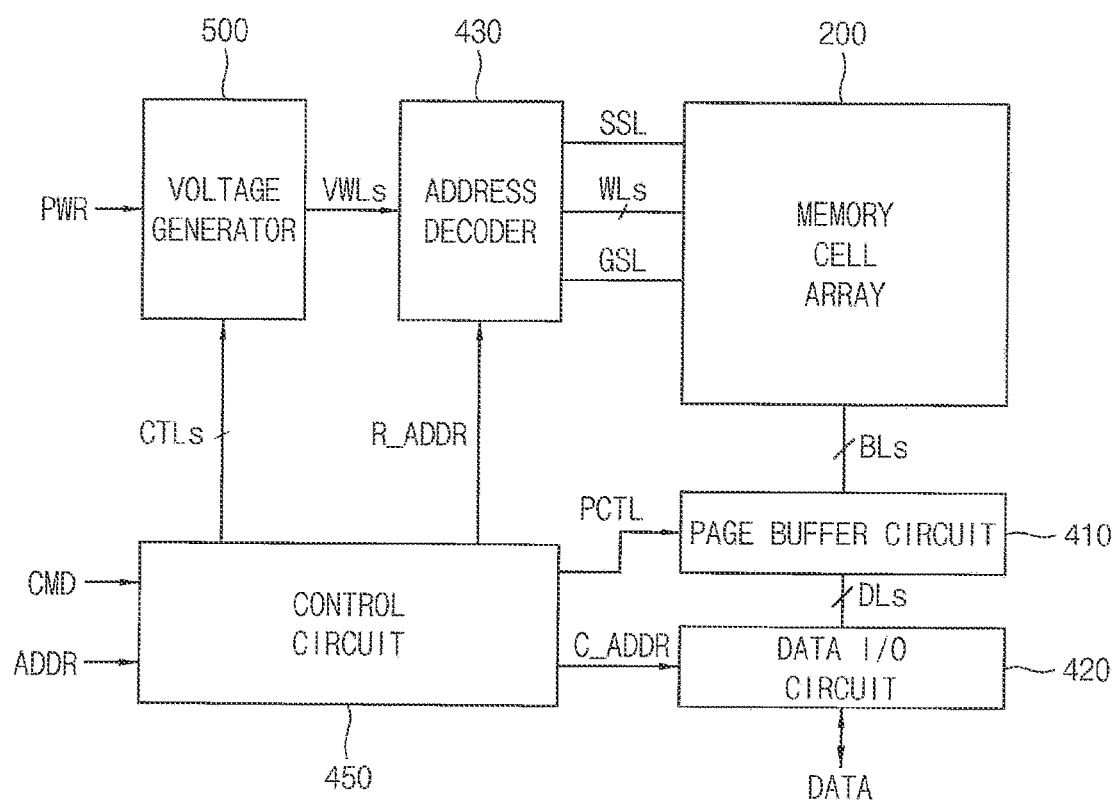
FIG. 6 is a block diagram illustrating the nonvolatile memory device in the storage device of FIG. 5 according to example embodiments.

FIG. 6 is a block diagram illustrating the nonvolatile memory device in the storage device of FIG. 5 according to example embodiments.

Referring to FIG. 6, the nonvolatile memory device 100 may include a memory cell array 200, an address decoder 430, a page buffer circuit 410, a data input/output (I/O) circuit 420, a control circuit 450 and a voltage generator 500.

The memory cell array 200 may be coupled to the address decoder 430 through a string selection line SSL, a plurality of word-lines WLs, and a ground selection line GSL. In addition, the memory cell array 200 may be coupled to the page buffer circuit 410 through a plurality of bit-lines BLs. The memory cell array 200 may include a plurality of nonvolatile memory cells coupled to the plurality of word-lines WLs and the plurality of bit-lines BLs.

In some example embodiments, the memory cell array 200 may be a three-dimensional memory cell array, which is formed on a substrate in a three-dimensional structure (or a vertical structure). In this case, the memory cell array 200 may include vertical cell strings that are vertically oriented such that at least one memory cell is located over another memory cell.

The control circuit 450 may receive a command (signal) CMD and an address (signal) ADDR from the memory controller 50 and control an erase loop, a program loop, and a read operation of the nonvolatile memory device 200 based on the command signal CMD and the address signal ADDR. The program loop may include a program operation and a program verification operation. The erase loop may include an erase operation and an erase verification operation.

For example, the control circuit 450 may generate control signals CTLs to control the voltage generator 500 and may generate a page buffer control signal PCTL to control the page buffer circuit 410 based on the command signal CMD. The control circuit 450 may generate a row address R_ADDR and a column address C_ADDR based on the address signal ADDR. The control circuit 450 may provide the row address R_ADDR to the address decoder 430 and provide the column address C_ADDR to the data I/O circuit 420.

The address decoder 430 may be coupled to the memory cell array 200 through the string selection line SSL, the plurality of word-lines WLs, and the ground selection line GSL. During the program operation or the read operation, the address decoder 430 may determine one of the plurality of word-lines WLs as a selected word-line and determine the rest of the plurality of word-lines WLs except for the selected word-line as unselected word-lines based on the row address R_ADDR.

The voltage generator 500 may generate word-line voltages VWLs, which are required for the operation of the nonvolatile memory device 200, based on the control signals CTLs. The voltage generator 500 may receive power PWR from the memory controller 50. The word-line voltages VWLs may be applied to the plurality of word-lines WLs through the address decoder 430.

For example, during the erase operation, the voltage generator 500 may apply an erase voltage to a well of the memory block and may apply a ground voltage to all word-lines of the memory block. During the erase verification operation, the voltage generator 500 may apply an erase verification voltage to all word-lines of the memory block or sequentially apply the erase verification voltage to word-lines in a word-line basis.

For example, during the program operation, the voltage generator 500 may apply a program voltage to the selected word-line and may apply a program pass voltage to the unselected word-lines. In addition, during the program verification operation, the voltage generator 500 may apply a program verification voltage to the selected word-line and may apply a verification pass voltage to the unselected word-lines.

The page buffer circuit 410 may be coupled to the memory cell array 200 through the plurality of bit-lines BLs. The page buffer circuit 410 may include a plurality of page buffers. The page buffer circuit 410 may temporarily store data to be programmed in a selected page or data read out from the selected page.

The data I/O circuit 420 may be coupled to the page buffer circuit 410. During the program operation, the data I/O circuit 420 may receive program data DATA from the memory controller 50 and provide the program data DATA to the page buffer circuit 410 through data lines DLs based on the column address C_ADDR received from the control circuit 450. During the read operation, the data I/O circuit 420 may provide read data DATA, which are stored in the page buffer circuit 410, to the memory controller 50 based on the column address C_ADDR received from the control circuit 450.

Figure 7:
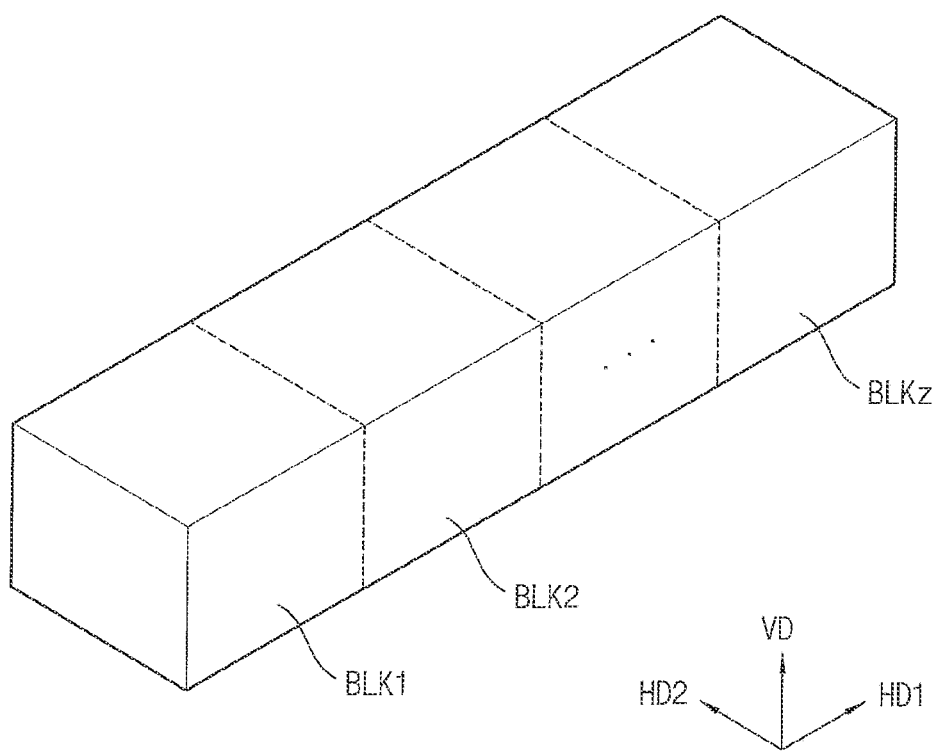
FIG. 7 is a block diagram illustrating an example of the memory cell array in the nonvolatile memory device of FIG. 6 according to example embodiments.

FIG. 7 is a block diagram illustrating an example of the memory cell array in the nonvolatile memory device of FIG. 6 according to example embodiments.

Referring to FIG. 7, the memory cell array 200 may include a plurality of memory blocks BLK1 to BLKz. Here, z is a natural number greater than two. The memory blocks BLK1 to BLKz extend along a first horizontal direction HD1, which may be for example an X-axis direction, a second horizontal direction HD2, which may be for example a Y-axis direction, and a vertical direction VD, which may be for example a Z-axis direction. In some example embodiments, the memory blocks BLK1 to BLKz are selected by the address decoder 450 in FIG. 6. For example, the address decoder 450 may select a memory block BLK corresponding to a block address among the memory blocks BLK1 to BLKz.

Figure 8A:
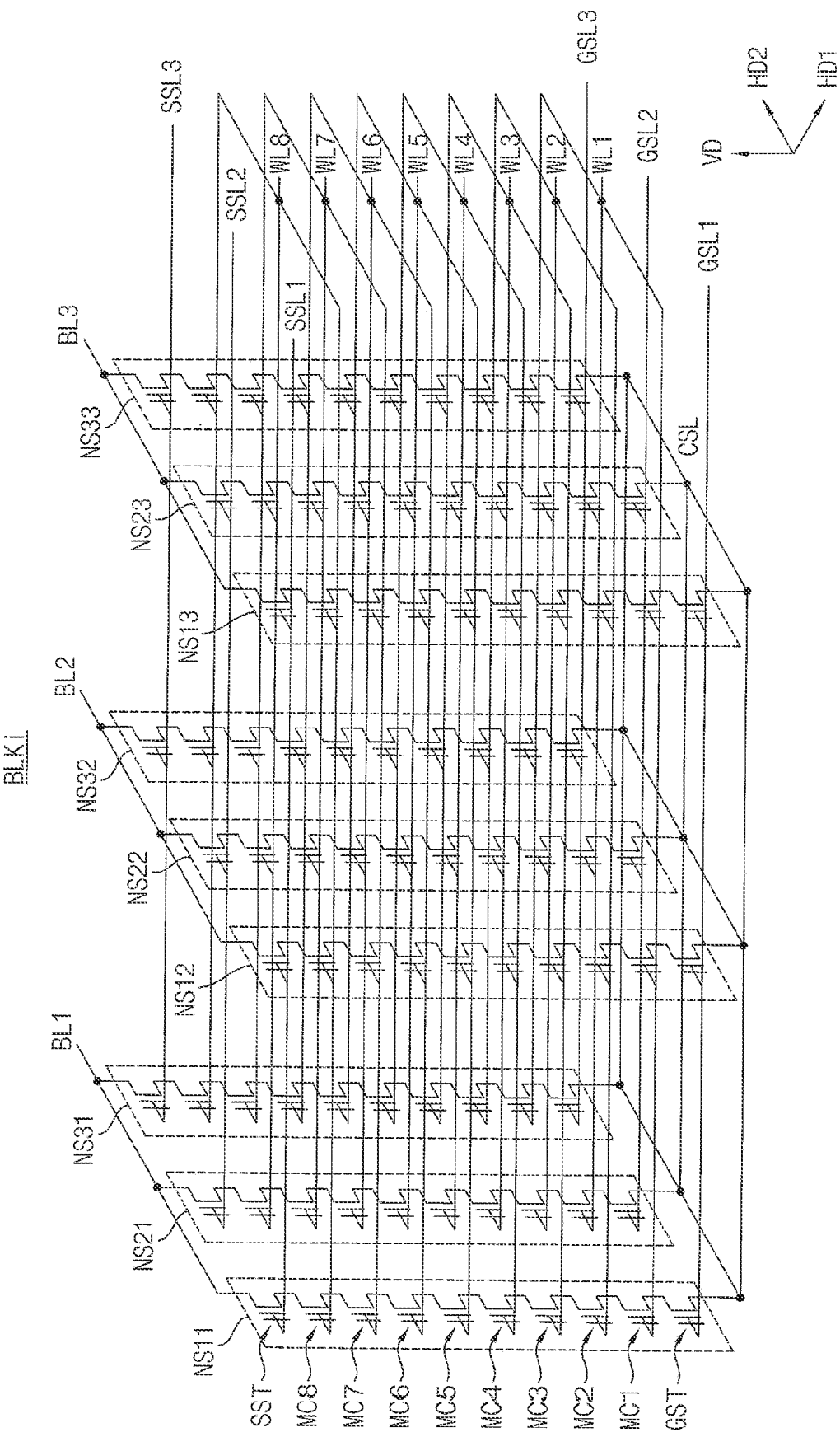
FIG. 8A is a circuit diagram illustrating one of the memory blocks of FIG. 7.

FIG. 8A is a circuit diagram illustrating one of the memory blocks of FIG. 7.

A memory block BLKi of FIG. 8A may be formed on a substrate SUB in a three-dimensional structure (or a vertical structure). Here, i may be one of 1 to z. For example, a plurality of memory cell strings included in the memory block BLKi may be formed in the vertical direction VD perpendicular to the substrate SUB.

Referring to FIG. 8A, the memory block BLKi may include a plurality of (memory) cell strings NS11 to NS33 coupled between bit-lines BL1, BL2 and BL3 and a common source line CSL. Each of the cell strings NS11 to NS33 may include a string selection transistor SST, a plurality of memory cells MC1 to MC8, and a ground selection transistor GST. In FIG. 8A, each of the cell strings NS11 to NS33 is illustrated to include eight memory cells MC1 to MC8. However, embodiments are not limited thereto. In some example embodiments, each of the cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., word-line WL1) having the same height may be commonly connected, and the ground selection lines GSL1 to GSL3 and the string selection lines SSL1 to SSL3 may be separated. In FIG. 8A, the memory block BLKi is illustrated to be coupled to eight word-lines WL1 to WL8 and three bit-lines BL1 to BL3. However, embodiments are not limited thereto. In some example embodiments, the memory cell array 200 may be coupled to any number of word-lines and bit-lines.

Figure 8B:
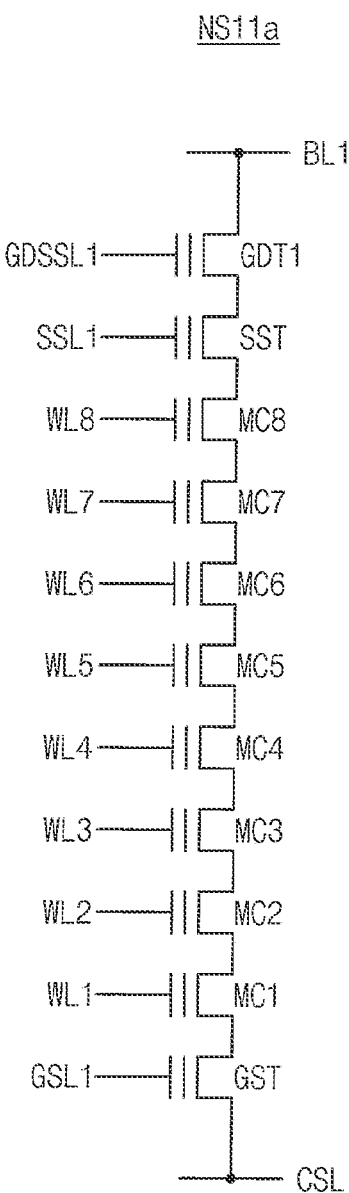
FIGS. 8B through 8D illustrate examples of one of cell strings in FIG. 8A, respectively, according to example embodiments.
Figure 8C:
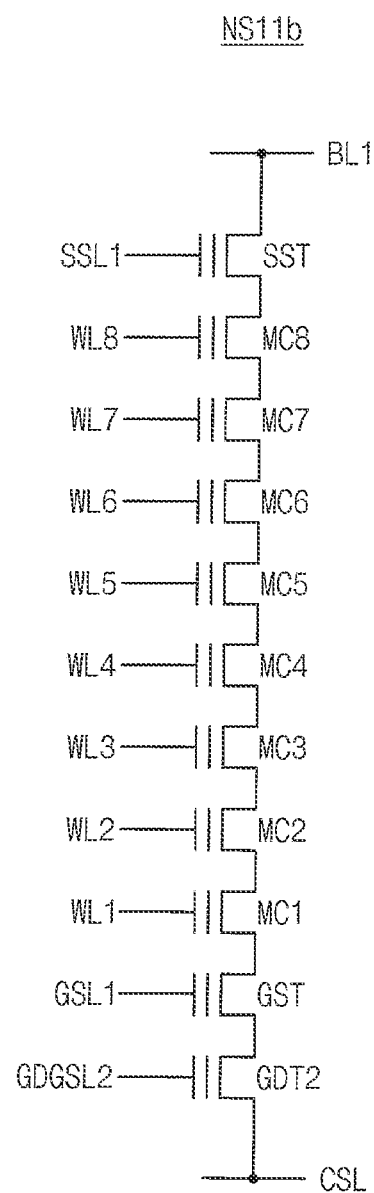
Figure 8D:
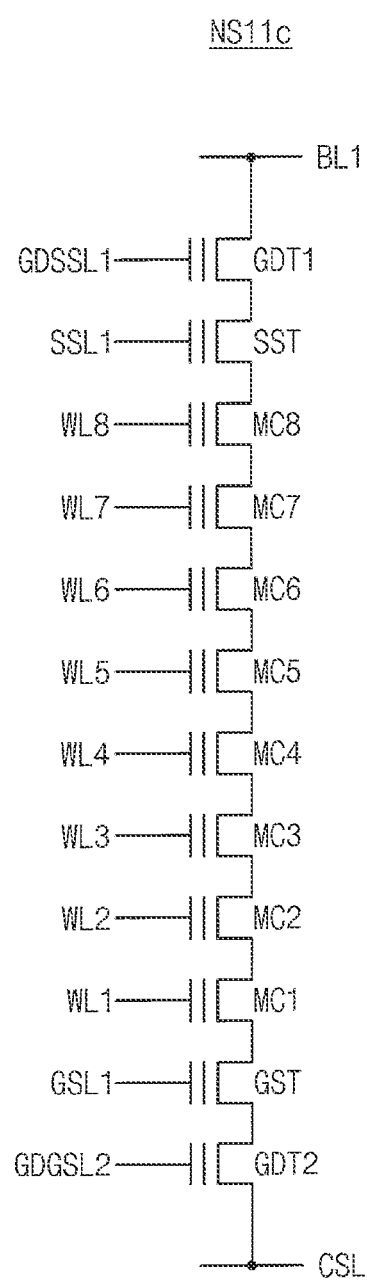

FIGS. 8B through 8D illustrate examples of one of the cell strings in FIG. 8A, respectively, according to example embodiments.

Referring to FIG. 8B, a cell string NS11a may include a ground selection transistor GST, a plurality of memory cells MC1 to MC8, a string selection transistor SST and a GIDL string selection transistor GDT1 connected in series between the common source line CSL and the bit-line BL1.

The GIDL string selection transistor GDT1 may be coupled to a GIDL string selection line GDSSL1. In this case, a unidirectional channel precharge may be performed in each of the cell strings during the bit-line set-up period PBLS, by applying a GIDL drain voltage to all or some of the plurality of bit-lines such that the GIDL drain voltage has a voltage level higher than a voltage difference between a GIDL threshold voltage and a GIDL on voltage during the bit-line set-up period PBLS. The GIDL on voltage corresponds to a voltage having a level to turn-on the GIDL string selection transistor GDT1. Each of the cell strings NS11 to NS33 in FIG. 8A may employ the cell string NS11a of FIG. 8B.

Referring to FIG. 8C, a cell string NS11b may include a GIDL ground selection transistor GDT2, a ground selection transistor GST, a plurality of memory cells MC1 to MC8 and a string selection transistor SST connected in series between the common source line CSL and the bit-line BL1. The GIDL ground selection transistor GDT2 may be coupled to a GIDL ground selection line GDGSL2. In this case, a unidirectional channel precharge may be performed in each of the cell strings during the bit-line set-up period PBLS by applying a GIDL drain voltage to the common source line CSL. Each of the cell strings NS11 to NS33 in FIG. 8A may employ the cell string NS11b of FIG. 8C.

Referring to FIG. 8D, a cell string NS11c may include a GIDL ground selection transistor GDT2, a ground selection transistor GST, a plurality of memory cells MC1 to MC8, a string selection transistor SST, and a GIDL string selection transistor GDT1 connected in series between the common source line CSL and the bit-line BL1. The GIDL ground selection transistor GDT2 may be coupled to a GIDL ground selection line GDGSL2 and the GIDL string selection transistor GDT1 may be coupled to a GIDL string selection line GDSSL1. In this case, a bidirectional channel precharge may be performed in each of the cell strings during the bit-line set-up period PBLS by applying the GIDL drain voltage to at least a portion of the plurality of bit-lines and applying the GIDL drain voltage to common the source line CSL. Each of the cell strings NS11 to NS33 in FIG. 8A may employ the cell string NS11c of FIG. 8D.

Figure 9:
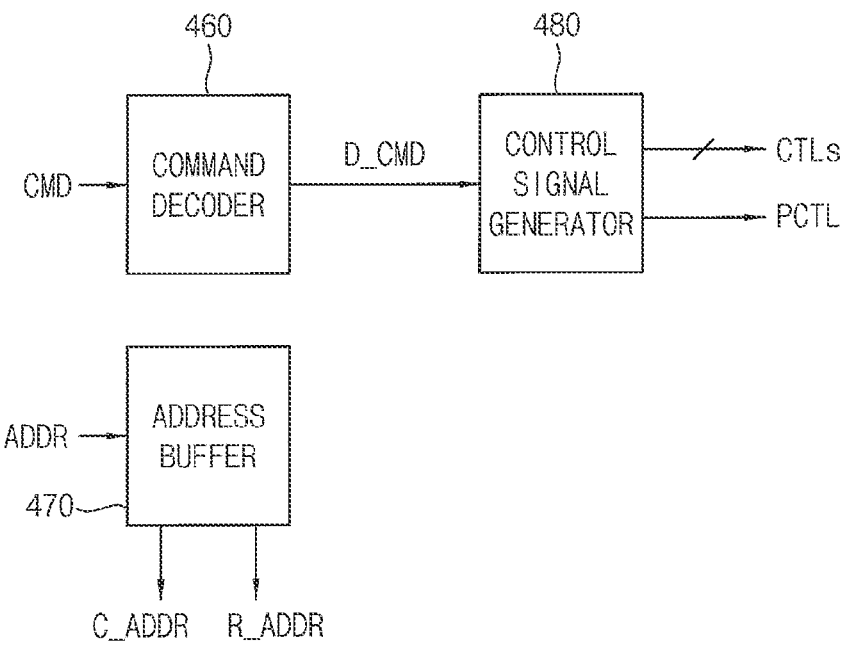
FIG. 9 is a block diagram illustrating the control circuit in the nonvolatile memory device of FIG. 6 according to example embodiments.

FIG. 9 is a block diagram illustrating the control circuit in the nonvolatile memory device of FIG. 6 according to example embodiments.

Referring to FIG. 9, the control circuit 450 may include a command decoder 460, an address buffer 470 and a control signal generator 480.

The command decoder 460 may decode the command CMD and provides a decoded command D_CMD to the control signal generator 480.

The address buffer 470 may receive the address (signal) ADDR, provide the row address R_ADDR to the address decoder 430 and provide the column address C_ADDR to the data I/O circuit 420.

The control signal generator 480 may receive the decoded command D_CMD, generate the control signals CTLs based on an operation directed by the decoded command D_CMD, provide the control signals CTLs to the voltage generator 500, generate the page buffer control signal PCTL, and provide the page buffer control signal PCTL to the page buffer circuit 410.

Figure 10:
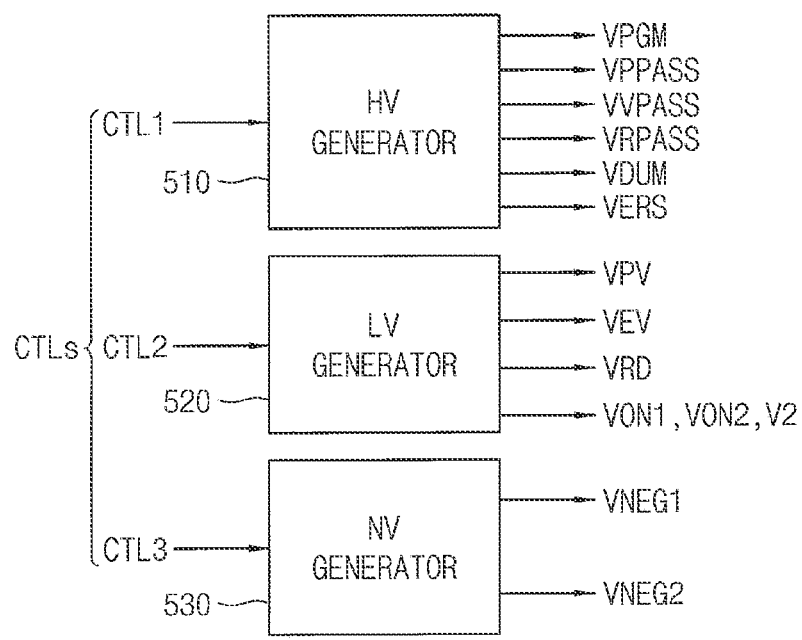
FIG. 10 is a block diagram illustrating the voltage generator in the nonvolatile memory device of FIG. 6 according to example embodiments.

FIG. 10 is a block diagram illustrating the voltage generator in the nonvolatile memory device of FIG. 6 according to example embodiments.

Referring to FIG. 10, the voltage generator 500 may include a high voltage generator 510 and a low voltage generator 520. The voltage generator 500 may further include a negative voltage generator 530.

The high voltage generator 510 may generate a program voltage VPGM, a program pass voltage VPPASS, a verification pass voltage VVPASS, a read pass voltage VRPASS, a dummy voltage VDUM, and an erase voltage VERS according to operations directed by the command CMD in response to a first control signal CTL1. The dummy voltage VDUM may include the first dummy voltage VDUM1 and the second dummy voltage VDUM2 in FIG. 4.

The program voltage 8A PGM may be applied to the selected word-line, and the program pass voltage VPPASS, the verification pass voltage VVPASS, and the read pass voltage VRPASS may be applied to the unselected word-lines. The dummy voltage VDUM may be applied to a dummy word-line, and the erase voltage VERS may be applied to the well of the memory block. The first control signal CTL1 may include a plurality of bits which indicate the operations directed by the decoded command D_CMD.

The low voltage generator 520 may generate a program verification voltage VPV, an erase verification voltage VER, a read voltage VRD, a first turn-on voltage VON1, a second turn-on voltage VON2, and a second voltage V2 according to operations directed by the command CMD in response to a second control signal CTL2.

The program verification voltage VPV, the read voltage VRD, and the erase verification voltage VER may be applied to the selected word-line according to an operation of the nonvolatile memory device 200. The first turn-on voltage VON1 and the second turn-on voltage VON2 may be applied to a string selection transistor and a ground selection transistor of each of the selected cell string and the unselected cell string. The second voltage V2 may be applied to the selected word-line and unselected word-lines. The second control signal CTL2 may include a plurality of bits which indicate the operations directed by the decode command D_CMD.

The negative voltage generator 530 may generate a first negative voltage VNEG1 and a second negative voltage VNEG2 which have negative levels according to operations directed by the command CMD in response to a third control signal CTL3. The third control signal CTL3 may include a plurality of bits which indicate the operations directed by the decoded command D_CMD. The first negative voltage VNEG1 may be applied to a selected word-line and unselected word-lines during the program recovery period, and the second negative voltage VNEG2 may be applied to the unselected word-lines during the bit-line set-up period.

Figure 11:
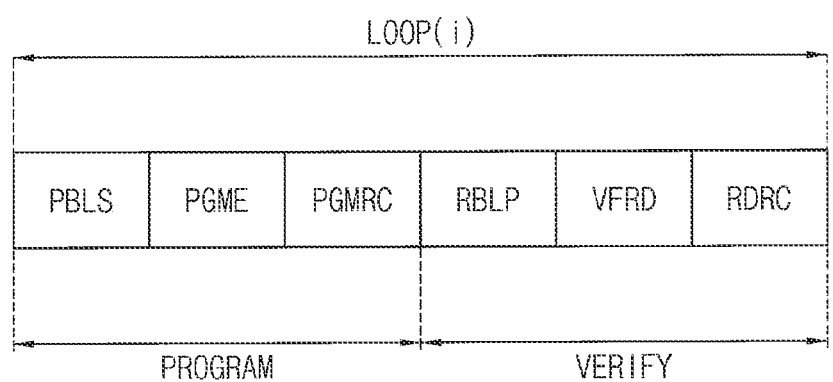
FIG. 11 is a diagram illustrating operation periods included in each of a plurality of program loops.

FIG. 11 is a diagram illustrating operation periods included in each of a plurality of program loops.

Referring to FIG. 11, each program loop LOOP(i) may include a program period PROGRAM to apply each of the program voltages VPGM1, VPGM2, and VPGM3 to a selected word-line for programming the selected memory cells and a verification period VERIFY to apply a verification read voltage VPV to the selected word-line for verifying the success of the program operation.

The program period PROGRAM may include the bit-line set-up period PBLS, a program execution period PGME and a program recovery period PGMRC. The verification period VERIFY may include a bit-line precharge period RBLP, a verification read period VFRD and a read recovery period RDRC. The bit-line set-up period PBLS, the program execution period PGME, the program recovery period PGMRC, and the verification read period VFRD are the same as described with reference to FIG. 2.

Figure 12:
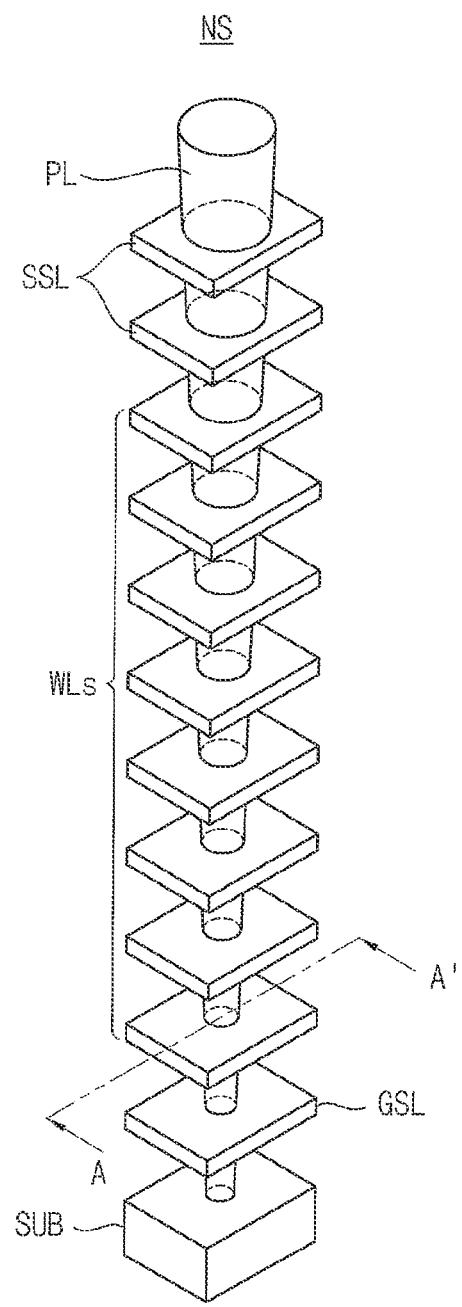
FIG. 12 is a diagram illustrating an example structure of a cell string.
Figure 13:
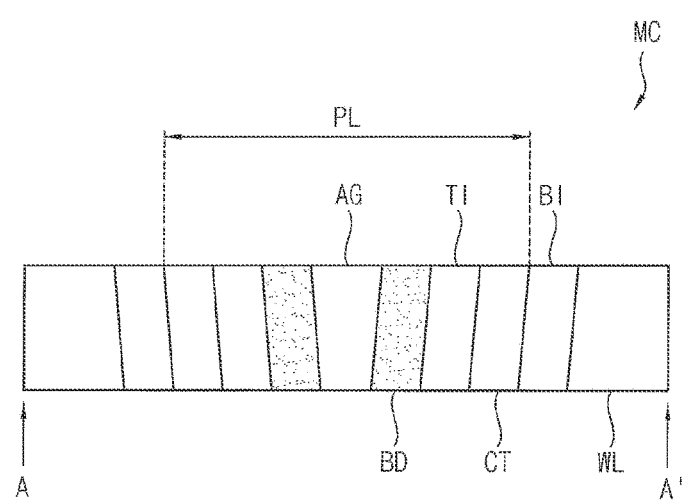
FIG. 13 is a diagram illustrating a memory cell included in the cell string of FIG. 12.

FIG. 12 is a diagram illustrating an example structure of a cell string and FIG. 13 is a diagram illustrating a memory cell MC included in the cell string of FIG. 12.

Referring to FIGS. 12 and 13, a pillar PL extending in a vertical direction may be formed on a substrate SUB for providing a cell string NS. The ground selection line GSL, the word-lines WLs, and the string selection lines SSL may be formed of conductive materials such as metals, which are parallel to the substrate SUB. The pillar PL may penetrate the conductive materials forming the ground selection line GSL, the word-lines WL, and the string selection lines SSL to contact the substrate SUB. The word-lines WL may include dummy word lines.

FIG. 13 illustrates a cross-sectional view cut along the line A-A' in FIG. 12. As an example, a cross-section of one memory cell MC corresponding to a word line is illustrated in FIG. 13. The pillar PL may include a body BD in a form of a cylinder, and an air gap AG may be provided in the body BD. The body BD may include silicon of a P-type, and the body BD may be a region in which a channel is formed.

The pillar PL may further include a tunnel insulation layer TI surrounding the body BD and a charge capturing layer CT surrounding the tunnel insulation layer T1. A blocking insulation layer BI may be provided between one word line WL and the pillar PL. The body BD, the tunnel insulation layer TI, the charge capturing layer CT, the blocking insulation layer BI and the one word line WL may form a transistor of a charge capturing type. In some example embodiments, the string selection transistor SST, the ground selection transistor GST, and the other memory cells may have the same structure as illustrated in FIG. 13.

As illustrated in FIGS. 12 and 13, the width or the cross-section area of the pillar PL may be decreased as the distance to the substrate SUB is decreased. When the same voltage is applied to the bodies of the ground selection transistor GST, the memory cells MC, and the string selection transistor SST and the same voltage is applied to the ground selection line GLS, the word lines WL and the string selection line SSL, the electric field formed in the memory cell located near the substrate SUB is greater than the electric field formed in the memory cell located far from the substrate SUB. These characteristics affect the program disturbance during the program operation.

Figure 14A:
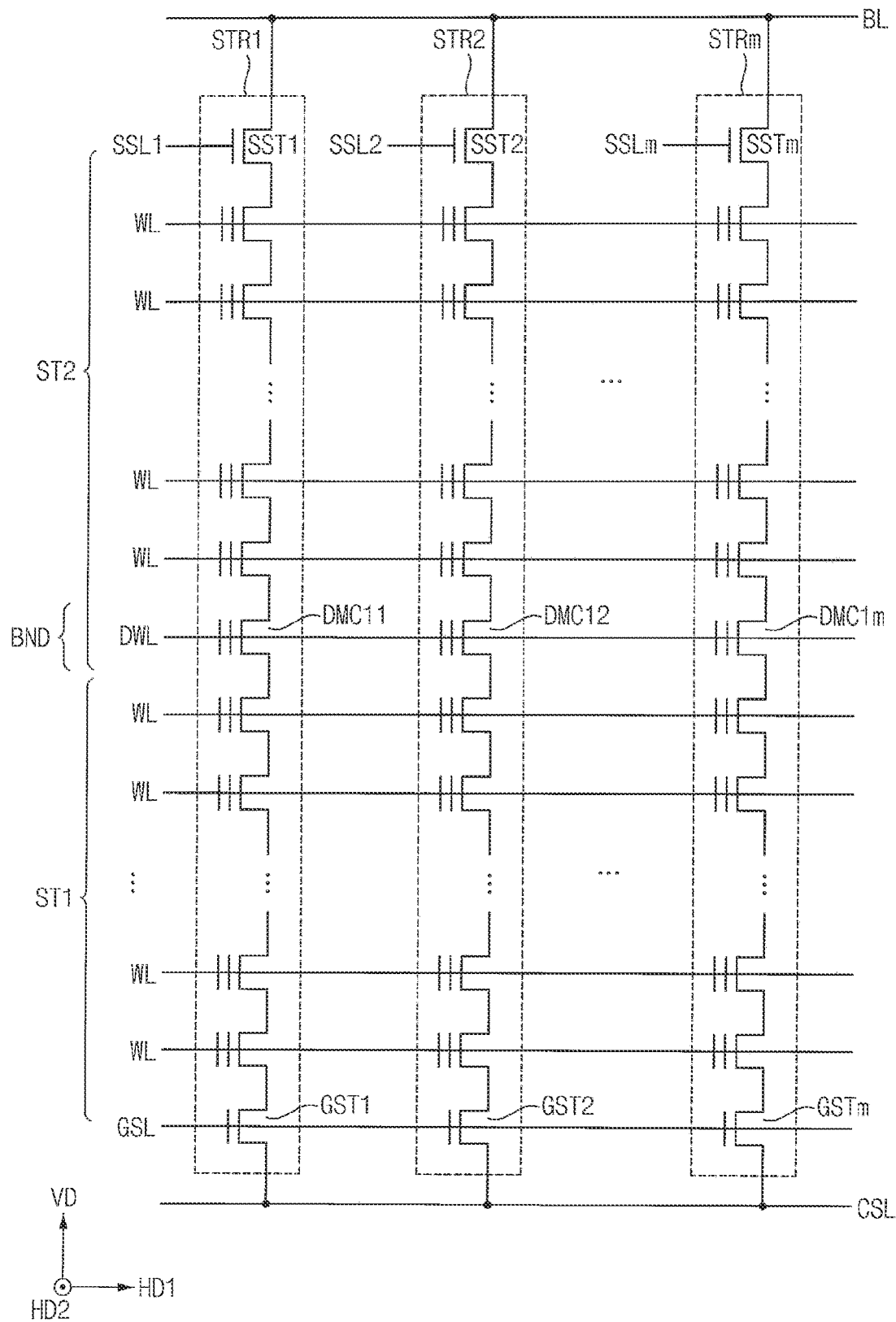
FIG. 14A is a circuit diagram illustrating a structure of a memory cell array according to example embodiments.
Figure 14B:
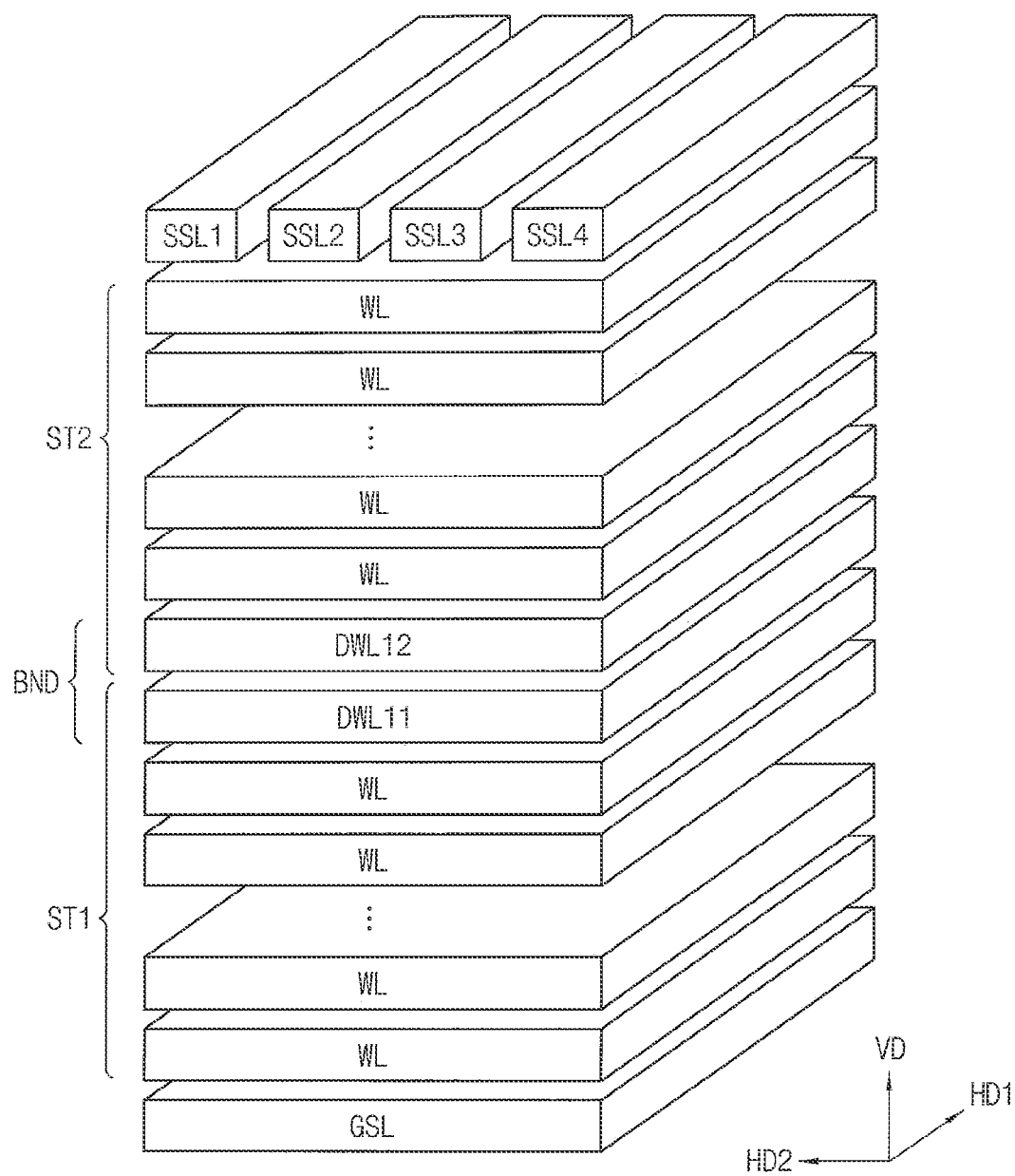
FIG. 14B is a perspective view illustrating a memory block corresponding to a structure of FIG. 14A.

FIG. 14A is a circuit diagram illustrating a structure of a memory cell array according to example embodiments, and FIG. 14B is a perspective view illustrating a memory block corresponding to a structure of FIG. 14A.

FIG. 14A illustrates two-dimensional version of a memory block including cell strings connected to one bit-line BL and one source line CSL for convenience of illustration, but it will be understood that the memory block may have a three-dimensional structure of a plurality of bit-lines as described with reference to FIGS. 7 and 8.

Referring to FIGS. 14A and 14B, a memory block may include a plurality of cell strings STR1~STRm connected between a bit-line BL and a source line CSL. The cell strings STR1~STRm may include string selection transistors SST1~SSTm controlled by string selection lines SSL1~SSLm, memory cells controlled by word-lines WL, dummy memory cells DMC11~DMC1*m* controlled by a dummy word-line DWL, and ground selection transistors GST1~GSTm controlled by a ground selection line GSL, respectively. Here, m is a natural number greater than 1. The plurality of cell strings STR1~STRm may be divided into a first stack ST1 and a second stack ST2 along the vertical direction VD. The second stack ST2 is disposed at a higher position than the first stack ST1 in the vertical direction VD.

Memory cells coupled to at least one word-line located at an edge of each of the first stack ST1 and the second stack ST2 may be dummy memory cells. The dummy memory cells may not store valid data or may store single-bit data.

The dummy memory cells DMC11~DMC1*m* may be included in the second stack ST2.

FIG. 14A illustrates an example embodiment that the ground selection transistors GST1~GSTm are connected to the same ground selection line GSL. In other example embodiments, the ground selection transistors are connected to respective ground selection lines.

In some example embodiments, as illustrated in FIGS. 14A, a boundary portion BND may include one gate line corresponding to the dummy word-line DWL that activates simultaneously the dummy memory cells DMC11~DMC1*m* connected thereto.

In some example embodiments, as illustrated in FIGS. 14B, a boundary portion BND may include two gate lines corresponding to dummy word-lines DWL11 and DWL12.

The dummy word-line DWL11 may be included in the first stack ST1 and the dummy word-line DWL12 may be included in the second stack ST2.

Figure 15:
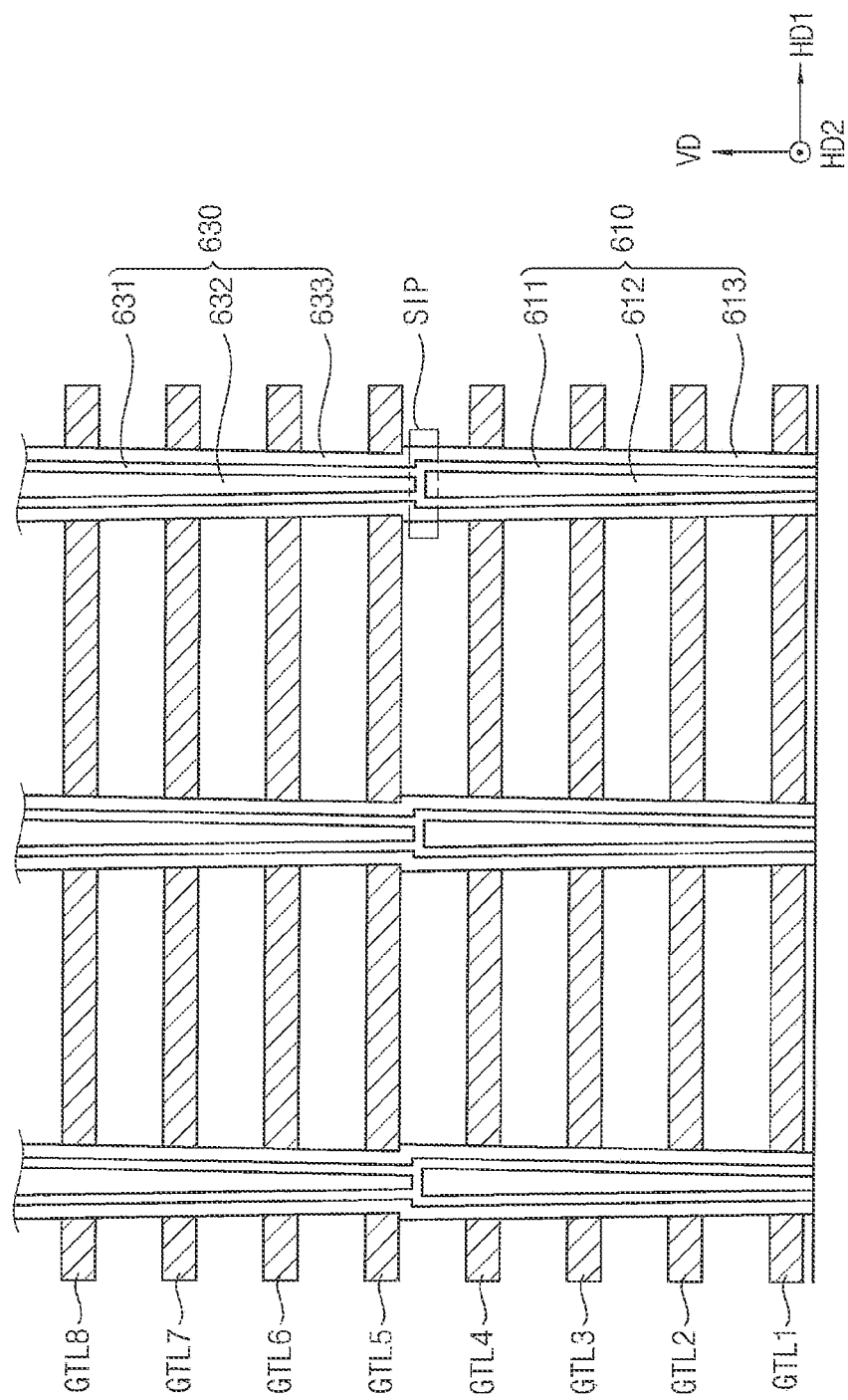
FIG. 15 is a cross-sectional view for describing an example embodiment of a boundary portion included in a memory block according to example embodiments.

FIG. 15 is a cross-sectional view for describing an example embodiment of a boundary portion included in a memory block according to example embodiments.

Referring to FIG. 15, a channel hole of each cell string STR may include a first sub channel hole 610 and a second sub channel hole 630. A channel hole may be referred to as a pillar. The first sub channel hole 610 may include a channel layer 611, an inner material 612 and an insulation layer 613. The second sub channel hole 630 may include a channel layer 631, an inner material 632 and an insulation layer 633. The channel layer 611 of the first channel hole 610 may be connected to the channel layer 631 of the second sub channel hole 630 through a P-type silicon pad SIP. The sub channel holes 610 and 630 may be formed using a stopper line GTL5 having an appropriate etch rate. For example, the stopper line GTL5 may be formed of polysilicon and the other gate lines GTL1~GTL4 and GTL6~GTL8 may be formed of metal such as tungsten to implement the appropriate etch rate.

The above-described boundary portion BND may correspond to the stopper layer GTL5 that is used to form the plurality of sub channel holes. The cells in the stopper layer GTL5 may be improper for storing data, and the stopper layer may be used as the boundary portion BND to form the dummy memory cells. Example embodiments are not limited to a boundary portion of one stopper layer, and the boundary portion may include two or more gate layers.

The dummy memory cells may be implemented with a cell type or transistor type. The cell type may include a floating gate as a flash memory cell, and the transistor type may not include the floating gate.

Figure 16:
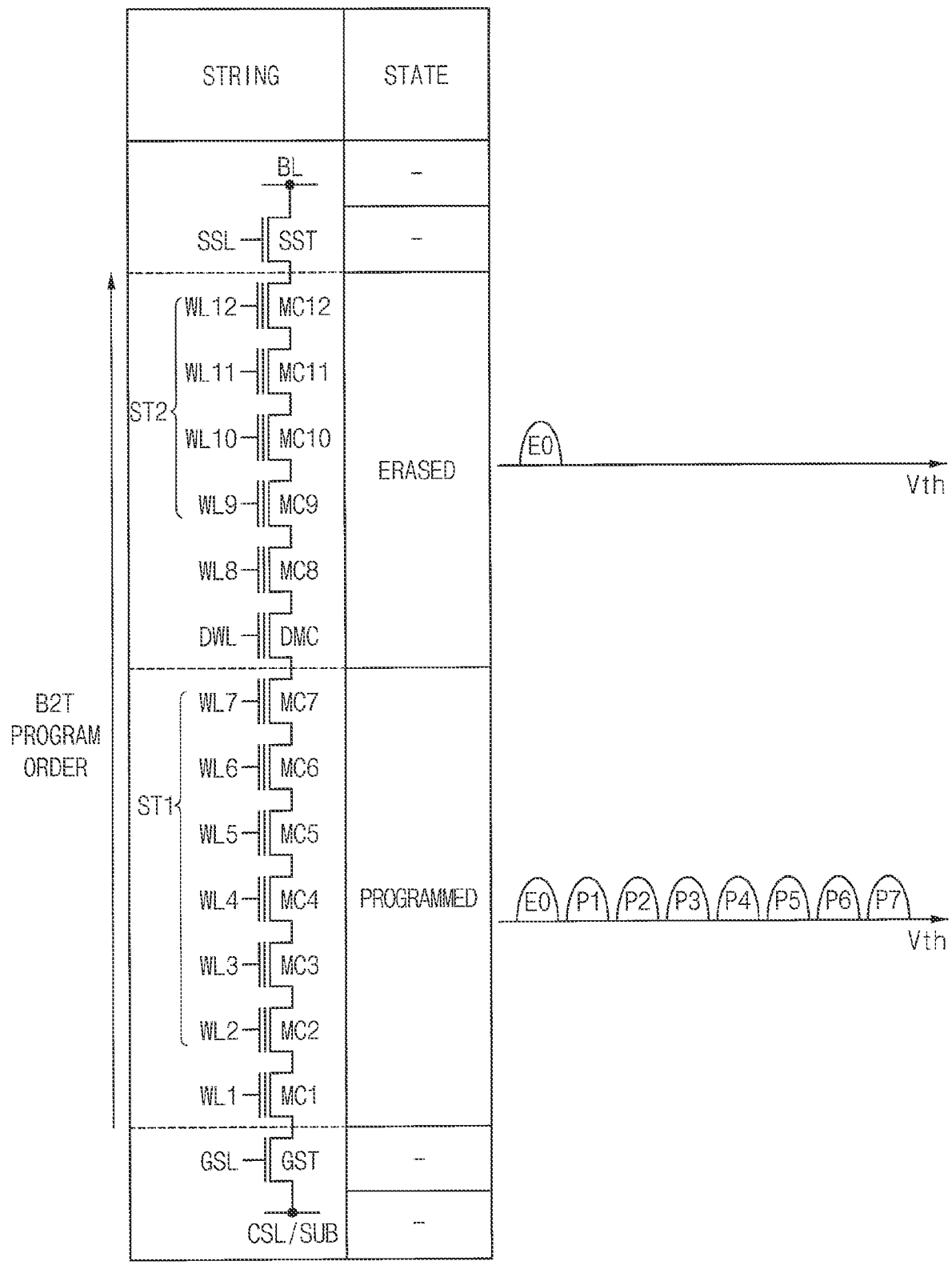
FIG. 16 is a diagram illustrating a program scenario according to example embodiments.

FIG. 16 is a diagram illustrating a program scenario according to example embodiments.

FIG. 16 illustrates one cell string including a string selection transistor SST connected to a string selection line SSL, a ground selection transistor GST connected to a ground selection line GSL, memory cells MC1~MC12 connected to word-lines WL1~WL12, and a dummy memory cell DMC connected to the dummy word-line DWL and states of memory cells. The cell string is connected between a bit-line BL and a common source line CSL coupled to the substrate SUB. FIG. 16 illustrates twelve memory cells and threshold voltage distributions Vth of triple level cell (TLC) storing three bits.

Referring to FIG. 16, according to a program scenario, the program operation may be performed in a upward direction from a lowermost word-line. In other words, as the data stored in the memory block increases, the data may be filled in erased cells in the upward direction from bottom to top (B2T program order).

Each of the programmed memory cells MC1~MC7 of a selected stack ST1 may be in one of the erased state EO and programmed states P1, P2, P3, P4, P5, P6 and P7 and not-programmed memory cells MC8~MC12 of an upper stack ST2 disposed at a higher position than the selected stack ST1 in the vertical direction VD are in an erased state EO.

Figure 17:
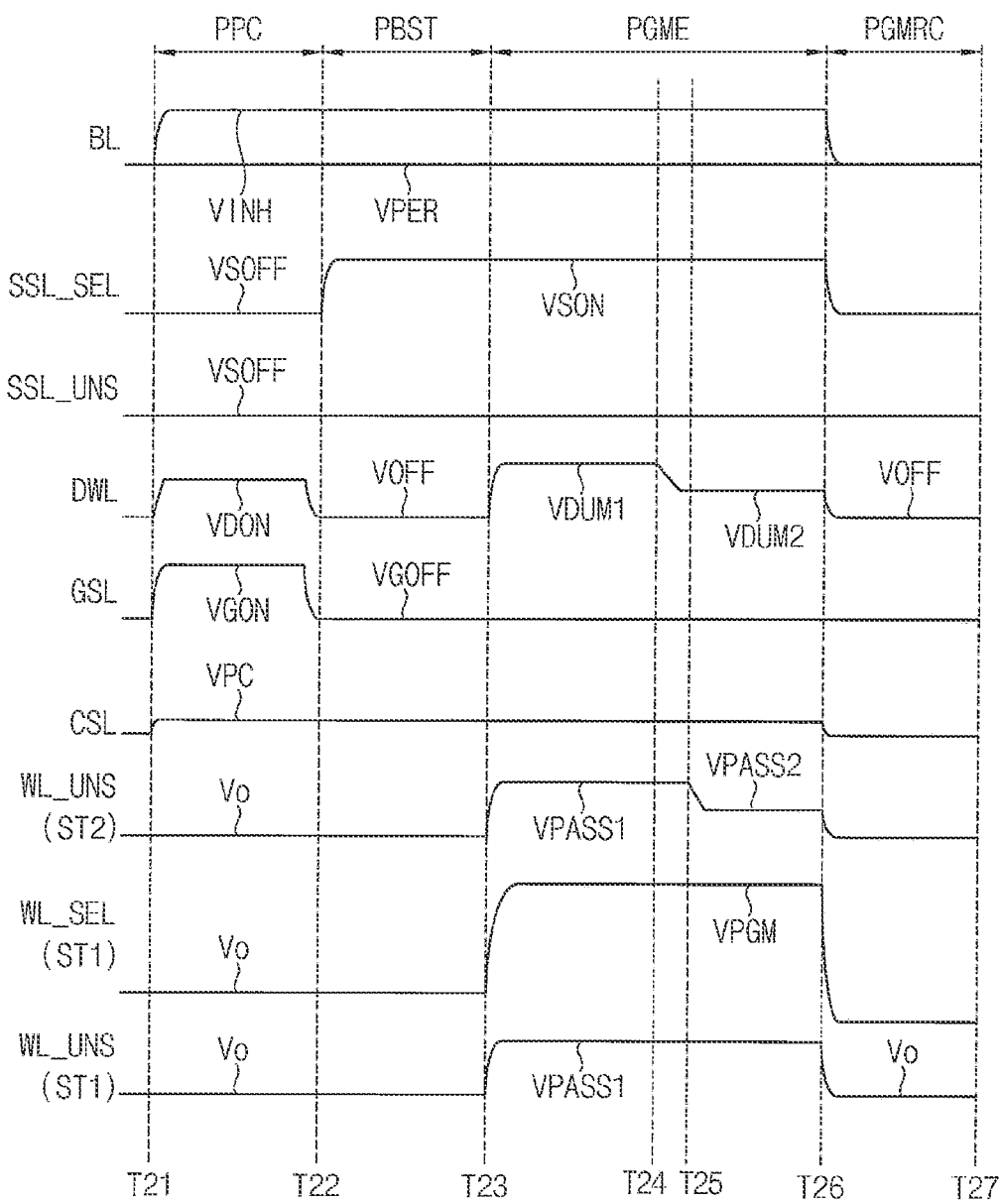
FIG. 17 is a timing diagram illustrating a program operation of a first stack according to the program scenario of FIG. 16.

FIG. 17 is a timing diagram illustrating a program operation of a first stack according to the program scenario of FIG. 16.

In FIG. 17, the first stack ST1 corresponds to a selected stack to be programmed and the second stack ST2 corresponds to an upper stack ST2 disposed at an upper position with respect to the first stack ST1 (e.g., the selected stack) in the vertical direction VD.

Time interval T21~T22 is a precharge period PPC, time interval T22~T23 is a boosting period PBST, time interval T23~T26 is a program execution period PGME while a program voltage VPGM is applied to the selected word-line WL_SEL, and time interval T26~T27 is a program recovery period PGMRC. Hereinafter, a turn-on voltage and a turn-off voltage represent voltage levels to turn on and off a corresponding transistor.

A program inhibition voltage VINH may be applied to the bit-line BL when it is a program inhibition bit-line and a program permission voltage VPER may be applied to bit-line BL when it is a program permission bit-line.

During the precharge period PPC, a turn-off voltage VSOFF is applied to a selected string selection line SSL_SEL and an unselected string selection line SSL_UNS, a turn-on voltage VDON is applied to a dummy word-line DWL, and a turn-on voltage VGON is applied to a ground selection line GSL. The ground selection transistor and the dummy memory cells are turned on and thus a precharge voltage VPC of the source line CSL is applied to the channels CH of the first stack ST1 and the second stack ST2.

As such, the precharge voltage VPC may be applied to the channels of the first stack ST1 and the second stack ST2 before performing the boosting operation of the boosting period PBST. During the precharge period PPC, an initialization voltage Vo may be applied to a selected word-line WL_SEL and unselected word-lines WL_UNS. The initialization voltage Vo may have a voltage level capable of turning on the erased memory cells.

During the boosting period PBST, a turn-on voltage VSON is applied to the selected string selection line SSL_SEL, a turn-off voltage VOFF is applied to the dummy word-line DWL, and thus the first stack ST1 and the second stack ST2 are electrically disconnected from each other. During the dummy memory cells being turned off, word-lines WL_UNS (ST1) and WL_SEL (ST1) of the first stack ST1 corresponding to the selected stack maintain the initialization voltage Vo and word-lines WL_UNS (ST2) of the second stack maintain the initialization voltage Vo. The program inhibition voltage VINH or the program permission voltage VPER may be applied to the channel of selected stack ST1 depending on the bit-line BL.

After the precharge period PPC, a turn-off voltage VGOFF is applied to the ground selection line GSL to electrically disconnect the cell strings from the source line CSL.

During program execution period PGME, a program voltage VPGM is applied to the selected word-line WL_SEL (ST1) of the first stack ST1 and the memory cells connected to the bit-lines BL to which the program permission voltage VPER is applied may be programmed A first pass voltage VPASS1 is applied to the unselected word-lines WL_UNS (ST1) of the first stack ST1 during the program execution period PGME.

During the program execution period PGME, a turn-on voltage VSON is applied to selected string selection line SSL_SEL and the turn-off voltage VSOFF is applied to the unselected string selection line SSL_UNS.

During a first sub period T23~T24 of the program execution period PGME, a first dummy voltage VDUM1 is applied to the dummy word-line DWL of the second stack ST2.

During a second sub period T24~T25 of the program execution period PGME, the first dummy voltage VDUM1 is reduced to a second dummy voltage VDUM2.

During the first sub period T23~T24 and the second sub period T24~T25, the first pass voltage VPASS1 is applied to the word-lines WL_UNS (ST2) of the second stack ST2.

During a third period T25~T26 of the program execution period PGME, the second dummy voltage VDUM2 is applied to the dummy word-line DWL of the upper stack ST2. During the third sub period T25~T26, a second pass voltage VPASS2 smaller than the first pass voltage VPASS1 is applied to the word-lines WL_UNS (ST2) of the second stack ST2.

During the program recovery period PGMRC, voltages of the word-lines WL_SEL (ST1) and WL_UNS (ST1) of the first stack ST1 corresponding to the selected stack are recovered to the initialization voltage Vo while reducing voltages of the word-lines WL_UNS (ST2) of the second stack ST2 corresponding to the upper stack from the first pass voltage VPASS1 to the initialization voltage Vo.

Figure 18:
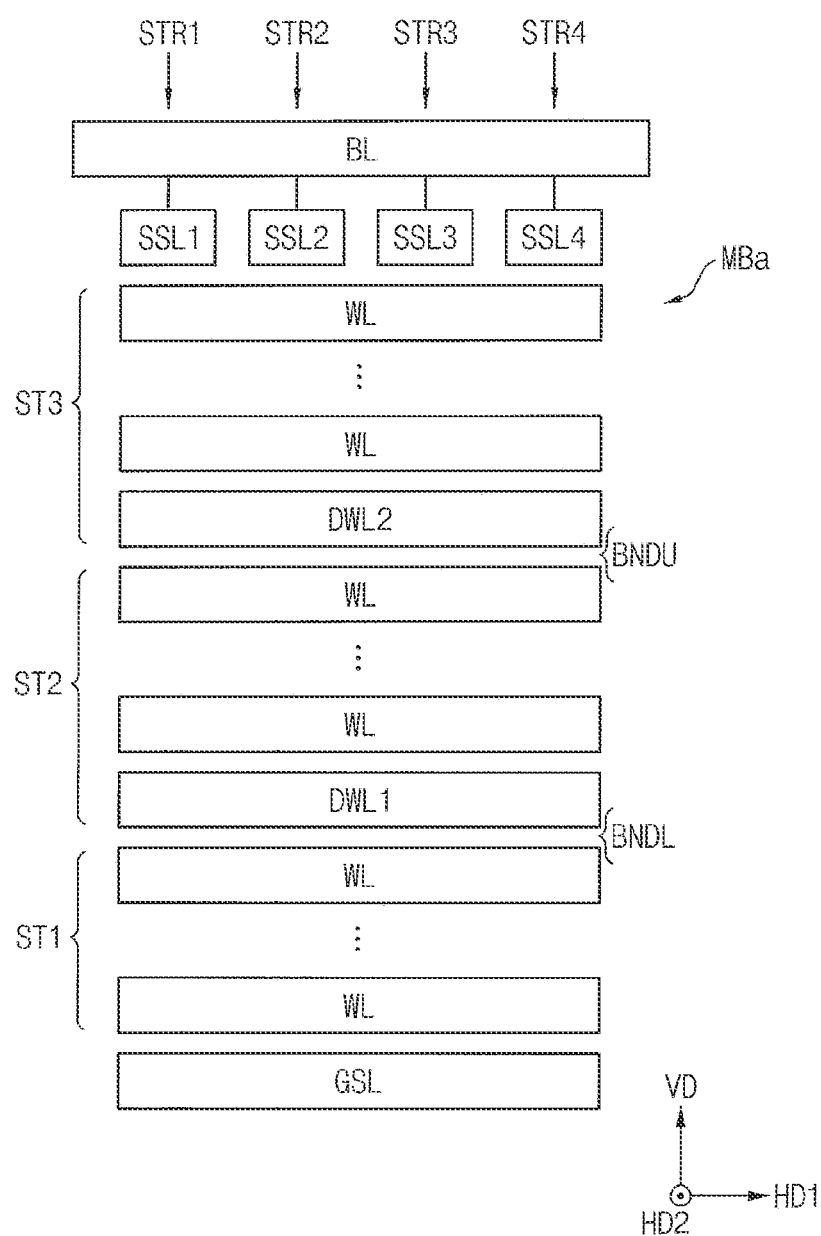
FIG. 18 is a cross-sectional view illustrating a memory block that is divided into three stacks according to example embodiments.

FIG. 18 is a cross-sectional view illustrating a memory block that are divided into three stacks according to example embodiments.

Referring to FIG. 18, the above-described boundary portion BND may include a lower boundary portion BNDL and an upper boundary portion BNDU. A memory block MBa may include a first stack ST1 below the lower boundary portion BNDL, a second stack ST2 between the lower boundary portion BNDL and the upper boundary portion BNDU and a third stack ST3 above the upper boundary portion BNDU. The memory block MBa may be divided into the first stack ST1, the second stack ST2 and the third stack ST3 in the vertical direction VD.

A first dummy word-line DWL1 is adjacent to the lower boundary portion BNDL and is included in the second stack ST2, and first dummy memory cells are coupled to the first dummy word-line DWL1. A second dummy word-line DWL2 is adjacent to the upper boundary portion BNDU and is included in the third stack ST3, and second dummy memory cells are coupled to the second dummy word-line DWL2.

Figure 20:
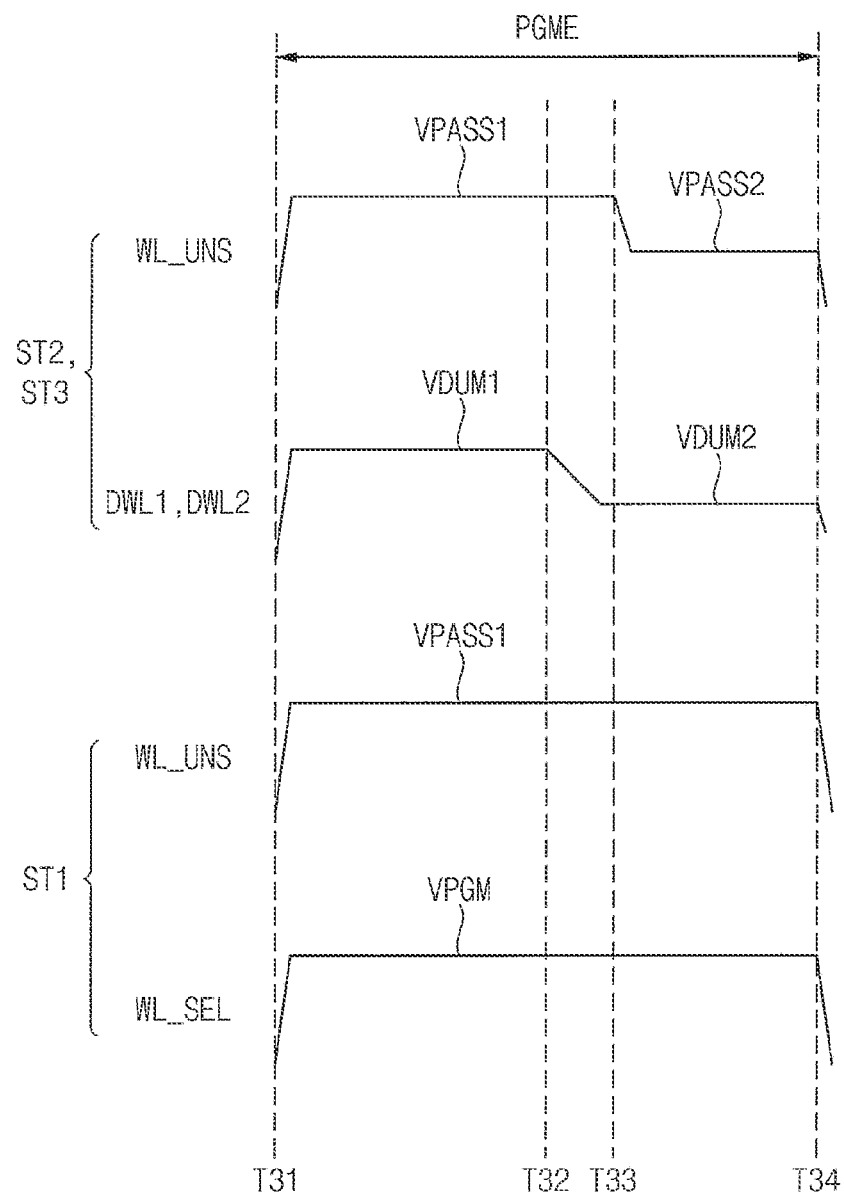
FIG. 20 illustrates a program execution period in FIG. 19.

FIG. 19 illustrates an example of programming the memory block of FIG. 18 and FIG. 20 illustrates a program execution period in FIG. 19. In FIGS. 19 and 20, descriptions repeated with FIG. 17 will be omitted.

FIG. 19 illustrates voltages during the above-described precharge period PPC, the boosting period PBST, the program execution period PGME and the program recovery period PGMRC.

FIG. 19 corresponds to a case where the program operation is performed to the first stack ST1. In this case, the first stack ST1 corresponds to above-describe selected stack and the second stack ST2 and the third stack ST3 correspond to the above-described upper stack.

During the precharge period PPC, the turn-off voltage VSOFF is applied to the string selection line SSL, the turn-on voltage VDON is applied to the first dummy word-line DWL1 and the second dummy word-line DWL2, and the turn-on voltage VGON is applied to the ground selection line GSL. The ground selection transistor GST and the first and second dummy memory cells DMC1, DMC2 are turned on and thus the precharge voltage VPC of the source line CSL is applied to the channels CH of the first stack ST1, the second stack ST2 and the third stack ST3.

During the boosting period PBST, the turn-on voltage VSON is applied to the string selection line SSL, the turn-off voltage VOFF is applied to the first dummy word-line DWL1 and the second dummy word-line DWL2, and thus the channels of the first stack ST1, the second stack ST2 and the third stack ST3 are electrically disconnected from each other. During the first and second dummy memory cells being turned off, word-lines WL_UNS (ST1) and WL_SEL (ST1) of the first stack ST1 corresponding to the selected stack maintain the initialization voltage Vo and word-lines WL_UNS (ST2 and ST3) of the second stack ST2 and the third stack ST3 corresponding to the upper stacks maintain the initialization voltage Vo. The program inhibition voltage VINH or the program permission voltage VPER may be applied to the channel of the first stack ST1 depending on the bit-line BL.

During the program execution period PGME, the program inhibition voltage VINH or the program permission voltage VPER may be applied to the bit-line BL, the turn-on voltage VSON is applied to the string selection line SSL, the program voltage VPGM is applied to the selected word-line WL_SEL (ST1) of the first stack ST1, and the first pass voltage VPASS1 is applied to the unselected word-lines WL_UNS (ST1) of the first stack ST1.

During a first sub period T31~T32 of the program execution period PGME, the first dummy voltage VDUM1 is applied to the first dummy word-line DWL1 and the second dummy word-line DWL2. During a second sub period T32~T33 of the program execution period PGME, the first dummy voltage VDUM1 is reduced to the second dummy voltage VDUM2. During a third period T33~T34 of the program execution period PGME, the second dummy voltage VDUM2 is applied to the first dummy word-line DWL1 and the second dummy word-line DWL2. A program forcing voltage may be applied to the bit-line BL during the first sub period T31~T32, and the program forcing voltage arrives at a channel of the first stack ST1.

During the first sub period T31~T32 and the second sub period T32~T33 of the program execution period PGME, the first pass voltage VPASS1 is applied to the word-lines WL_UNS (ST2 and ST3) of the second stack ST2 and the third stack ST3. During the third sub period T33~T34 of the program execution period PGME, the second pass voltage VPASS2 smaller than the first pass voltage VPASS1 is applied to the word-lines WL_UNS (ST2 and ST3) of the second stack ST2 and the third stack ST3.

During the program recovery period PGMRC, the turn-off voltage VSOFF is applied to the string selection line SSL, the turn-off voltage VOFF is applied to the first dummy word-line DWL1 and the second dummy word-line DWL2, and other voltages are the same as described with reference to FIG. 17.

Therefore, the first and second dummy memory cells are turned off by applying the second dummy voltage VDUM2 to the first dummy word-line DWL1 and the second dummy word-line DWL2 during the third sub period T33~T34. Thus, a program disturbance that the word-lines WL_UNS (ST2 and ST3) of the second stack ST2 and the third stack ST3, corresponding to the upper stacks, may receive from the first stack ST1 may be cut off (blocked).

Figure 22:
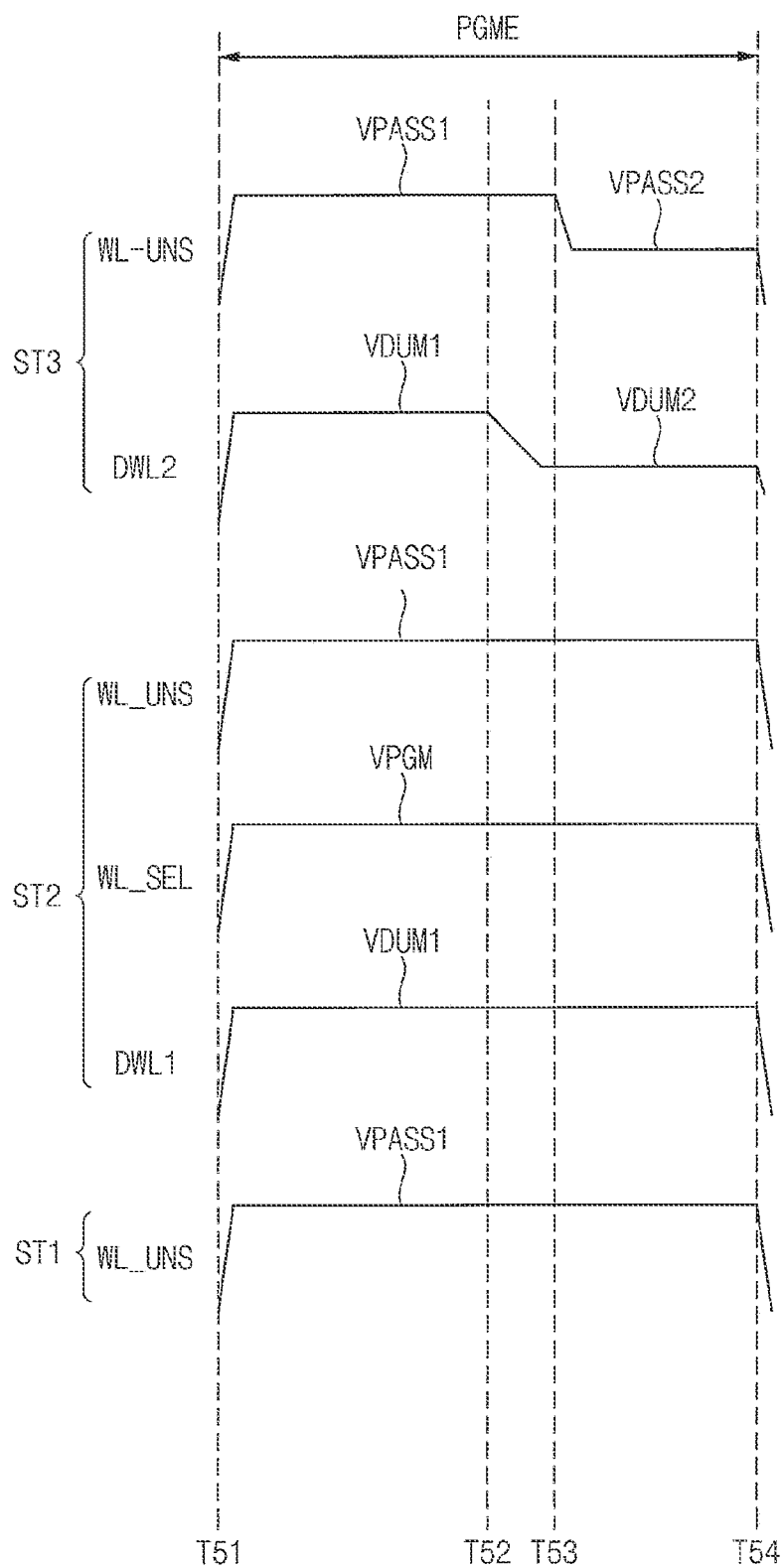
FIG. 22 illustrates a program execution period in FIG. 21.

FIG. 21 illustrates an example of programming the memory block of FIG. 18 and FIG. 22 illustrates a program execution period in FIG. 21. In FIGS. 21 and 22, descriptions repeated with respect to FIG. 17 will be omitted.

FIG. 21 illustrates voltages during the above-described precharge period PPC, the boosting period PBST, the program execution period PGME and the program recovery period PGMRC.

FIG. 22 corresponds to a case where the program operation is performed to the second stack ST2. In this case, the second stack ST2 corresponds to above-describe selected stack, the first stack ST1 corresponds to a lower stack and the third stack ST3 correspond to the above-described upper stack.

Operations during the precharge period PPC and the boosting period PBST are the same as the operations in FIG. 19, and description on the operations during the precharge period PPC and the boosting period PBST will be omitted.

Referring to FIGS. 21 and 22, during the program execution period PGME, the program inhibition voltage VINH or the program permission voltage VPER may be applied to the bit-line BL, the turn-on voltage VSON is applied to the string selection line SSL, the program voltage VPGM is applied to a selected word-line WL_SEL(ST2) of the second stack ST2, the first pass voltage VPASS1 is applied to the unselected word-lines WL_UNS (ST2) of the second stack ST2, and the first dummy voltage VDUM1 is applied to the first dummy word-line DWL1 of the second stack ST2.

During a first sub period T51~T52 of the program execution period PGME, the first dummy voltage VDUM1 is applied to the second dummy word-line DWL2 of the third stack ST3. During a second sub period T52~T53 of the program execution period PGME, the first dummy voltage VDUM1 is reduced to the second dummy voltage VDUM2 for the second dummy word-line DWL2 of the third stack ST3. During a third period T53~T54 of the program execution period PGME, the second dummy voltage VDUM2 is applied to the second dummy word-line DWL2.

During the first sub period T51~T52 and the second sub period T52~T53 of the program execution period PGME, the first pass voltage VPASS1 is applied to the word-lines WL_UNS (ST3) of the third stack ST3 corresponding to the upper stack. During the third sub period T53~T54 of the program execution period PGME, the second pass voltage VPASS2 smaller than the first pass voltage VPASS1 is applied to the word-lines WL_UNS (ST3) of the third stack ST3.

During the program execution period PGME, the first pass voltage VPASS1 is applied to the word-lines WL_UNS (ST1) of the first stack ST3 corresponding to the lower stack.

During the program recovery period PGMRC, the turn-off voltage VSOFF is applied to the string selection line SSL, the turn-off voltage VOFF is applied to the first dummy word-line DWL1 and the second dummy word-line DWL2, and other voltages are the same as described with reference to FIG. 17.

Therefore, the second dummy memory cells are turned off by applying the second dummy voltage VDUM2 to the second dummy word-line DWL2 during the third sub period T53~T54. Thus, a program disturbance that the word-lines WL_UNS (ST3) of the third stack ST3, corresponding to the upper stack, may receive from the second stack ST2 may be cut off (blocked).

Figure 24:
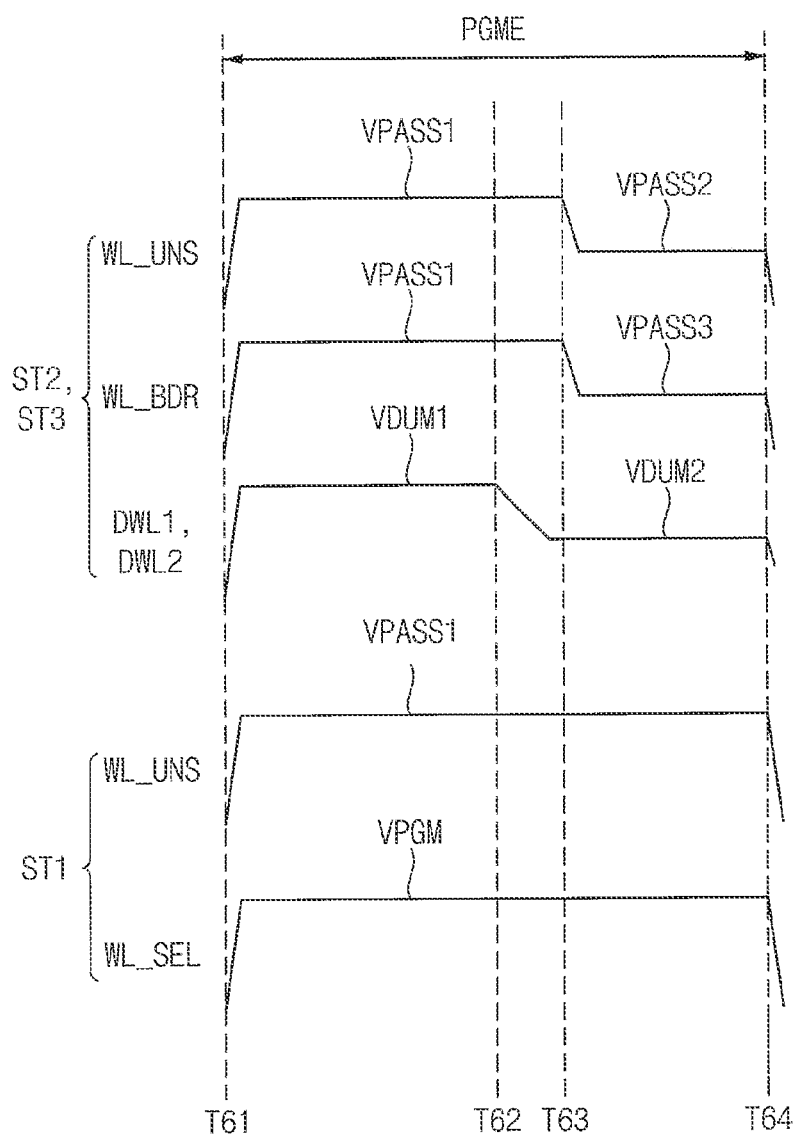
FIG. 24 illustrates a program execution period in FIG. 23.

FIG. 23 illustrates an example of programming the memory block of FIG. 18 and FIG. 24 illustrates a program execution period in FIG. 23. In FIGS. 23 and 24, descriptions repeated with respect to FIG. 19 will be omitted.

FIG. 23 corresponds to a case where the program operation is performed to the first stack ST1. In this case, the first stack ST1 corresponds to above-describe selected stack and the second stack ST2 and the third stack ST3 correspond to the above-described upper stack.

Operations during the precharge period PPC and the boosting period PBST are the same as the operations in FIG. 19, and description on the operations during the precharge period PPC and the boosting period PBST will be omitted.

Referring to FIGS. 23 and 24, during the program execution period PGME, the program inhibition voltage VINH or the program permission voltage VPER may be applied to the bit-line BL, the turn-on voltage VSON is applied to the string selection line SSL, the program voltage VPGM is applied to a selected word-line WL_SEL(ST1) of the first stack ST1, and the first pass voltage VPASS1 is applied to the unselected word-lines WL_UNS (ST1) of the first stack ST1.

During a first sub period T61~T62 of the program execution period PGME, the first dummy voltage VDUM1 is applied to the first dummy word-line DWL1 and the second dummy word-line DWL2. During a second sub period T62~T63 of the program execution period PGME, the first dummy voltage VDUM1 is reduced to the second dummy voltage VDUM2. During a third period T63~T64 of the program execution period PGME, the second dummy voltage VDUM2 is applied to the first dummy word-line DWL1 and the second dummy word-line DWL2.

During the first sub period T61~T62 and the second sub period T62~T63 of the program execution period PGME, the first pass voltage VPASS1 is applied to the word-lines WL_UNS (ST2 and ST3) of the second stack ST2 and the third stack ST3. During the third sub period T63~T64 of the program execution period PGME, the second pass voltage VPASS2 smaller than the first pass voltage VPASS1 is applied to the word-lines WL_UNS (ST2 and ST3) of the second stack ST2 and the third stack ST3. During the third sub period T63~T64 of the program execution period PGME, a third pass voltage VPASS3 smaller than the second pass voltage VPASS2 is applied to boundary word-lines WL_BDR of the second stack ST2 and the third stack ST3, which are respectively adjacent to the first dummy word-line DWL1 and the second dummy word-line DWL2.

During the program recovery period PGMRC, the turn-off voltage VSOFF is applied to the string selection line SSL, the turn-off voltage VOFF is applied to the first dummy word-line DWL1 and the second dummy word-line DWL2, and other voltages are the same as described with reference to FIG. 17.

Therefore, the first and second dummy memory cells are turned off by applying the second dummy voltage VDUM2 to the first dummy word-line DWL1 and the second dummy word-line DWL2 and by applying the third pass voltage VPASS3 smaller the second pass voltage VPASS2 to the boundary word-lines WL_BDR (ST2 and ST3) during the third sub period T63~T64. Thus, a program disturbance that the word-lines WL_UNS (ST2 and ST3) of the second stack ST2 and the third stack ST3, corresponding to the upper stacks, may receive from the first stack ST1 may be cut off (blocked).

Figure 26:
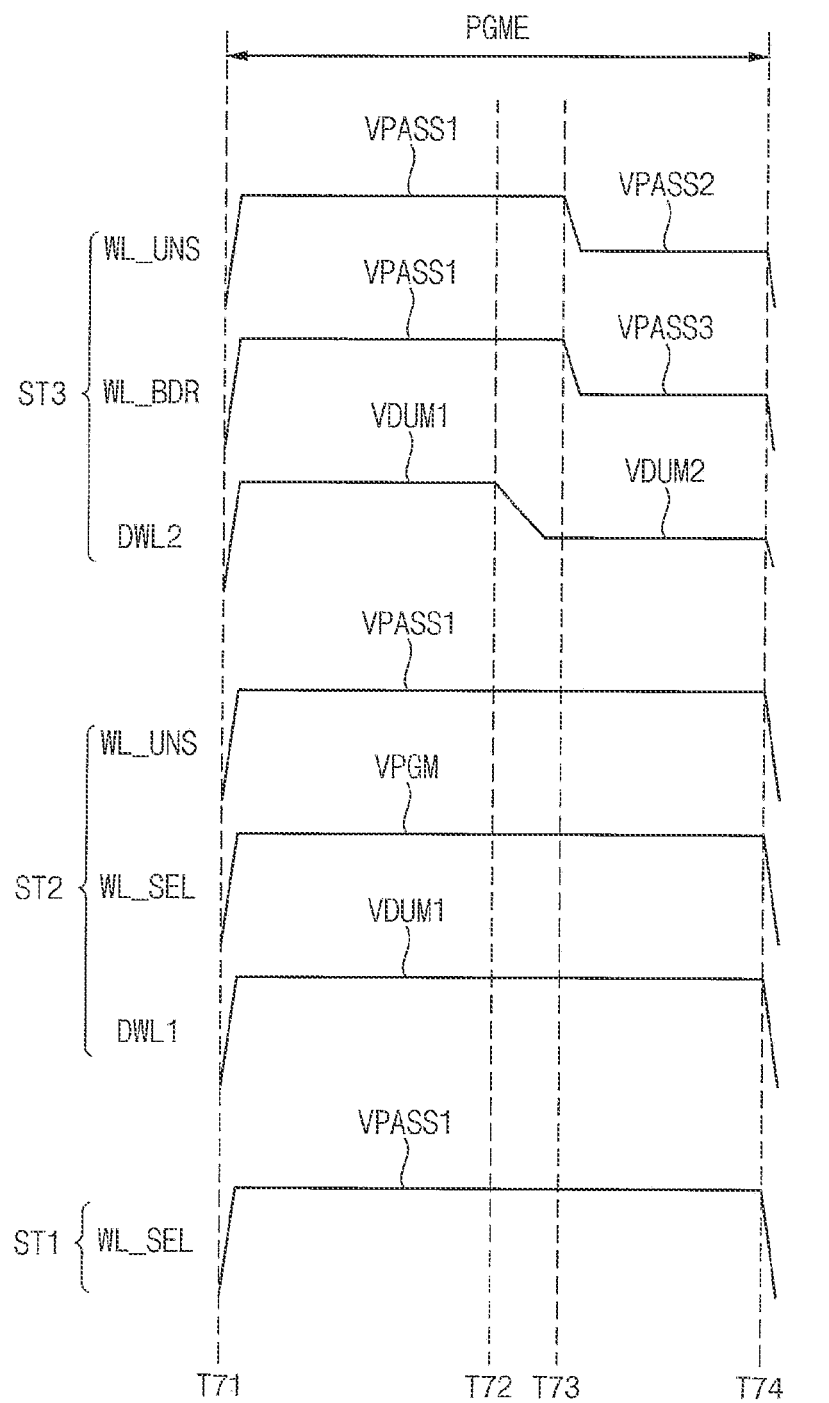
FIG. 26 illustrates a program execution period in FIG. 25.

FIG. 25 illustrates an example of programming the memory block of FIG. 18, and FIG. 26 illustrates a program execution period in FIG. 25. In FIGS. 25 and 26, descriptions repeated with respect to FIG. 19 will be omitted.

FIG. 25 illustrates voltages during the above-described precharge period PPC, the boosting period PBST, the program execution period PGME and the program recovery period PGMRC.

FIG. 25 corresponds to a case where the program operation is performed to the second stack ST2. In this case, the second stack ST2 corresponds to above-describe selected stack, the first stack ST1 corresponds to a lower stack and the third stack ST3 correspond to the above-described upper stack.

Operations during the precharge period PPC and the boosting period PBST are the same as the operations in FIG. 19, and description on the operations during the precharge period PPC and the boosting period PBST will be omitted.

During a first sub period T71~T72 of the program execution period PGME, the first dummy voltage VDUM1 is applied to the second dummy word-line DWL2 of the third stack ST3. During a second sub period T72~T73 of the program execution period PGME, the first dummy voltage VDUM1 is reduced to the second dummy voltage VDUM2. During a third period T73~T74 of the program execution period PGME, the second dummy voltage VDUM2 is applied to the second dummy word-line DWL2.

During the first sub period T71~T72 and the second sub period T72~T73 of the program execution period PGME, the first pass voltage VPASS1 is applied to the word-lines WL_UNS (ST3) of the third stack ST3 corresponding to the upper stack. During the third sub period T73~T74 of the program execution period PGME, the second pass voltage VPASS2 smaller than the first pass voltage VPASS1 is applied to the word-lines WL_UNS (ST3) of the third stack ST3. During the third sub period T73~T74 of the program execution period PGME, a third pass voltage VPASS3 smaller than the second pass voltage VPASS2 is applied to boundary word-line WL_BDR of the third stack ST3, which is adjacent to the second dummy word-line DWL2.

During the program execution period PGME, the first pass voltage VPASS1 is applied to the word-lines WL_UNS (ST1) of the first stack ST3 corresponding to the lower stack.

During the program recovery period PGMRC, the turn-off voltage VSOFF is applied to the string selection line SSL, the turn-off voltage VOFF is applied to the first dummy word-line DWL1 and the second dummy word-line DWL2, and other voltages are the same as described with reference to FIG. 17.

Therefore, the second dummy memory cells are turned off by applying the second dummy voltage VDUM2 to the second dummy word-line DWL2 and by applying the third pass voltage VPASS3 smaller the second pass voltage VPASS2 to the boundary word-line WL_BDR (ST3) during the third sub period T73~T74. Thus, a program disturbance that the word-lines WL_UNS (ST3) of the third stack ST3, corresponding to the upper stacks, may receive from the second stack ST2 may be cut off (blocked).

Figure 27:
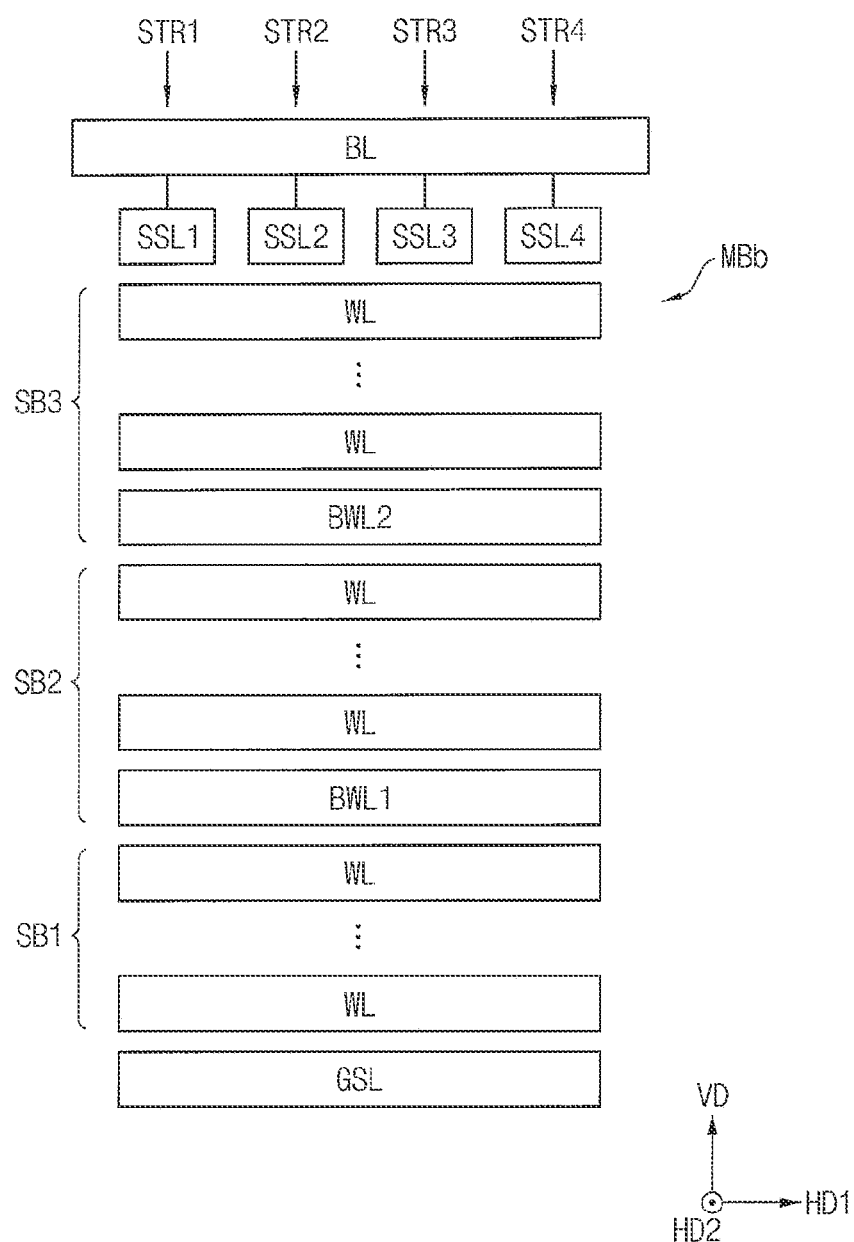
FIG. 27 is a cross-sectional view illustrating a memory block divided into three sub-blocks according to example embodiments.

FIG. 27 is a cross-sectional view illustrating a memory block divided into three sub-blocks according to example embodiments.

Referring to FIG. 27, a memory block MBb may be divided into a first sub-block SB1, a second sub-block SB2, and a third sub-block SB3 in the vertical direction VD. The second sub-block SB2 may include a boundary word-line BWL1 adjacent to the first sub-block SB1. The third sub-block SB3 may include a boundary word-line BWL2 adjacent to the second sub-block SB2. Each of the first sub-block SB1, the second sub-block SB2, and the third sub-block SB3 may include a plurality of word-lines WL. Each of the first sub-block SB1, the second sub-block SB2, and the third sub-block SB3 may be smaller than a physical block. An erase operation may be performed on each of the first sub-block SB1, the second sub-block SB2, and the third sub-block SB3.

In each of the second sub-block SB2 and the third sub-block SB3, word-lines except the boundary word-lines BWL1 and BWL2 may be referred to as internal word-lines.

In FIG. 27, each of memory cells coupled to the boundary word-lines BWL1 and BWL2 may store fewer data bits than may be stored in each of memory cells coupled to inner word-lines.

FIG. 28 illustrates an example of programming the memory block of FIG. 27 according to example embodiments.

In FIG. 28, the first sub-block SB1 may include memory cells MC1, MC2, MC3 and MC4, the second sub-block SB2 may include memory cells MC5, MC6, MC7 and MC8, and the third sub-block SB3 may include memory cells MC9, MC10, MC11 and MC12. The memory cell MC5 may be coupled to the boundary word-line BWL1 and the memory cell MC9 may be coupled to the boundary word-line BWL2.

FIG. 28 illustrates voltages during the above-described precharge period PPC, the boosting period PBST, the program execution period PGME, and the program recovery period PGMRC.

FIG. 28 corresponds to a case where the program operation is performed to the first stack ST1. In this case, the first sub-block SB1 corresponds to a selected sub-block and the second sub-block SB2 and the third sub-block SB3 correspond to upper sub-blocks.

During the precharge period PPC, the turn-off voltage VSOFF is applied to the string selection line SSL, a turn-on voltage VBON is applied to the boundary word-lines BWL1 and BWL2, and the turn-on voltage VGON is applied to the ground selection line GSL. The ground selection transistor and the memory cells coupled to the boundary word-lines BWL1 and BWL2 are turned on, and thus the precharge voltage VPC of the source line CSL is applied to the channels of the first sub-block SB1, the second sub-block SB2, and the third sub-block SB3.

During the boosting period PBST, the turn-on voltage VSON is applied to the string selection line SSL. The turn-off voltage VOFF is applied to the boundary word-lines BWL1 and BWL2, and thus the channels of the first sub-block SB1, the second sub-block SB2, and the third sub-block SB3 are electrically disconnected from each other. During the memory cells coupled to the boundary word-lines BWL1 and BWL2 being turned off, unselected word-lines of the first sub-block SB1 corresponding to the selected sub-block maintain the initialization voltage Vo and word-lines of the second sub-block SB2 and the third sub-block SB3 corresponding to the upper sub-blocks maintain the initialization voltage Vo.

During the program execution period PGME, the program inhibition voltage VINH or the program permission voltage VPER may be applied to the bit-line BL, the turn-on voltage VSON is applied to the string selection line SSL, the program voltage VPGM is applied to a selected word-line of the first sub-block SB1, and the first pass voltage VPASS1 is applied to unselected word-lines of the first sub-block SB1.

During a first sub period of the program execution period PGME, the first dummy voltage VDUM1 is applied to the boundary word-lines BWL1 and BWL2. During a second sub period of the program execution period PGME, the first dummy voltage VDUM1 is reduced to the second dummy voltage VDUM2. During a third period of the program execution period PGME, the second dummy voltage VDUM2 is applied to the boundary word-lines BWL1 and BWL2. A program forcing voltage may be applied to the bit-line BL during the first sub period, and the program forcing voltage arrives at a channel of the first sub-block SB1.

During the first sub period and the second sub period of the program execution period PGME, the first pass voltage VPASS1 is applied to the internal word-lines except the boundary word-lines BWL1 and BWL2 of the second sub-block SB2 and the third sub-block SB3. During the third sub period of the program execution period PGME, the second pass voltage VPASS2 smaller than the first pass voltage VPASS1 is applied to the internal word-lines of the second sub-block SB2 and the third sub-block SB3.

During the program recovery period PGMRC, the turn-off voltage VSOFF is applied to the string selection line SSL, the turn-off voltage VSOFF is applied to the boundary word-lines BWL1 and BWL2, and other voltages are the same as described with reference to FIG. 17.

Therefore, the memory cells coupled to the boundary word-lines BWL1 and BWL2 are turned off by applying the second dummy voltage VDUM2 to the boundary word-lines BWL1 and BWL2 during the third sub period. Thus, a program disturbance that the word-lines of the second sub-block SB2 and the third sub-block SB3, corresponding to the upper sub-blocks, may receive from the first sub-block SB1 corresponding to the selected sub-block may be cut off (blocked).

FIG. 29 illustrates an example of programming the memory block of FIG. 27 according to example embodiments.

In FIG. 29, the first sub-block SB1 may include memory cells MC1, MC2, MC3 and MC4, the second sub-block SB2 may include memory cells MC5, MC6, MC7 and MC8, and the third sub-block SB3 may include memory cells MC9, MC10, MC11 and MC12. The memory cell MC5 may be coupled to the boundary word-line BWL1, and the memory cell MC9 may be coupled to the boundary word-line BWL2.

FIG. 29 illustrates voltages during the above-described precharge period PPC, the boosting period PBST, the program execution period PGME, and the program recovery period PGMRC.

FIG. 29 corresponds to a case where the program operation is performed to the second stack ST2. In this case, the second sub-block SB2 corresponds to a selected sub-block, the first sub-block SB1 corresponds to a lower sub-block, and the third sub-block SB3 correspond to an upper sub-block.

Operations during the precharge period PPC and the boosting period PBST are the same as the operations in FIG. 28, and description on the operations during the precharge period PPC and the boosting period PBST will be omitted.

During the program execution period PGME, the program inhibition voltage VINH or the program permission voltage VPER may be applied to the bit-line BL and the turn-on voltage VSON is applied to the string selection line SSL. In addition, the program voltage VPGM is applied to a selected word-line of the second sub-block SB2, the first pass voltage VPASS1 is applied to unselected word-lines of the second sub-block SB2, the first dummy voltage VUM1 is applied to the boundary word-line BWL1, and the first pass voltage VPASS1 is applied to word-lines of the first sub-block SB1.

During a first sub period of the program execution period PGME, the first dummy voltage VDUM1 is applied to the boundary word-line BWL2. During a second sub period of the program execution period PGME, the first dummy voltage VDUM1 applied to the boundary word-line BWL2 is reduced to the second dummy voltage VDUM2. During a third period of the program execution period PGME, the second dummy voltage VDUM2 is applied to the boundary word-line BWL2.

During the first sub period and the second sub period of the program execution period PGME, the first pass voltage VPASS1 is applied to the internal word-lines except the boundary word-line of the third sub-block SB3. During the third sub period of the program execution period PGME, the second pass voltage VPASS2 smaller than the first pass voltage VPASS1 is applied to the internal word-lines of the third sub-block SB3.

During the program recovery period PGMRC, the turn-off voltage VSOFF is applied to the string selection line SSL, the turn-off voltage VOFF is applied to the boundary word-lines BWL1 and BWL2, and other voltages are the same as described with reference to FIG. 17.

Therefore, the memory cells coupled to the boundary word-line BWL2 are turned off by applying the second dummy voltage VDUM2 to the boundary word-line BWL2 during the third sub period. Thus, a program disturbance that the word-lines of the third sub-block SB3, corresponding to the upper sub-block, may receive from the second sub-block SB2 corresponding to the selected sub-block may be cut off (blocked).

Figure 30:
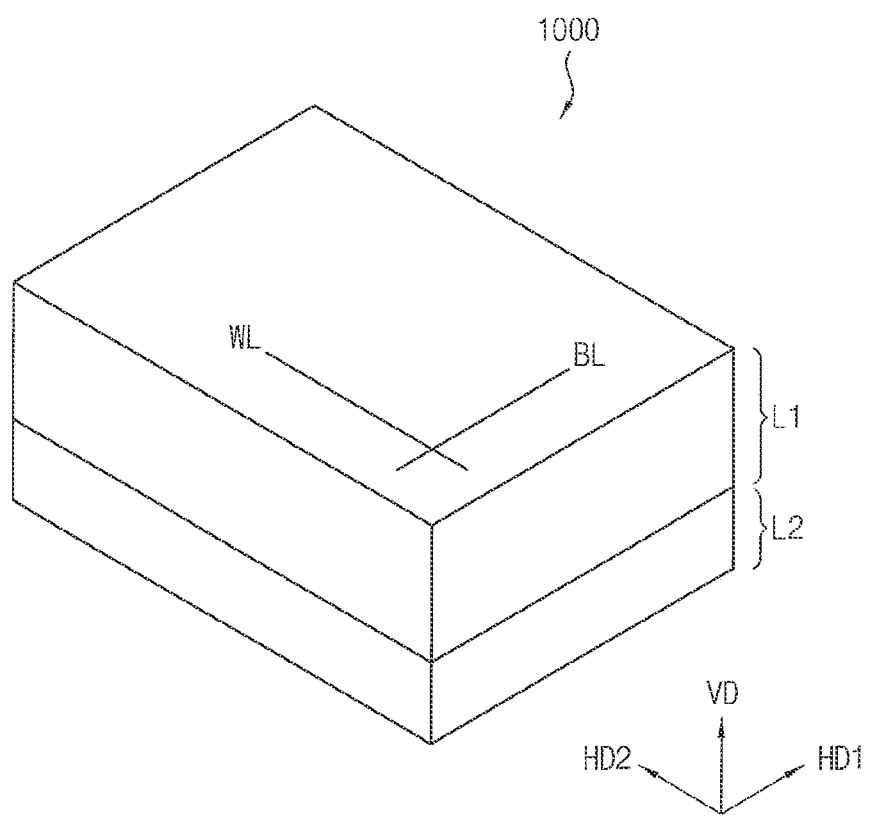
FIG. 30 schematically illustrates a structure of a nonvolatile memory device according to example embodiments.

FIG. 30 schematically illustrates a structure of a nonvolatile memory device according to example embodiments.

Referring to FIG. 30, a nonvolatile memory device 1000 may include a first semiconductor layer L1 and a second semiconductor layer L2, and the first semiconductor layer L1 may be stacked in the vertical direction VD with respect to the second semiconductor layer L2. The second semiconductor layer L2 may be under the first semiconductor layer L1 in the vertical direction VD. Accordingly, the second semiconductor layer L2 may be close to a substrate.

In example embodiments, the memory cell array 200 in FIG. 6 may be formed (or, provided) on the first semiconductor layer L1, and the address decoder 130, the page buffer circuit 410, the data I/O circuit 420, the control circuit 450 and the voltage generator 500 in FIG. 6 may be formed (or, provided) on the second semiconductor layer L2. Accordingly, the nonvolatile memory device 1000 may have a structure in which the memory cell array 200 is on a peripheral circuit including the address decoder 130, the page buffer circuit 410, the data I/O circuit 420, the control circuit 450. and the voltage generator 500; that is, a cell over periphery (COP) structure. The COP structure may effectively reduce an area in a horizontal direction and improve the degree of integration of the nonvolatile memory device 1000.

The bit-lines BL may extend in a first horizontal direction HD1, and the word-lines WL may extend in a second horizontal direction HD2.

Figure 31:
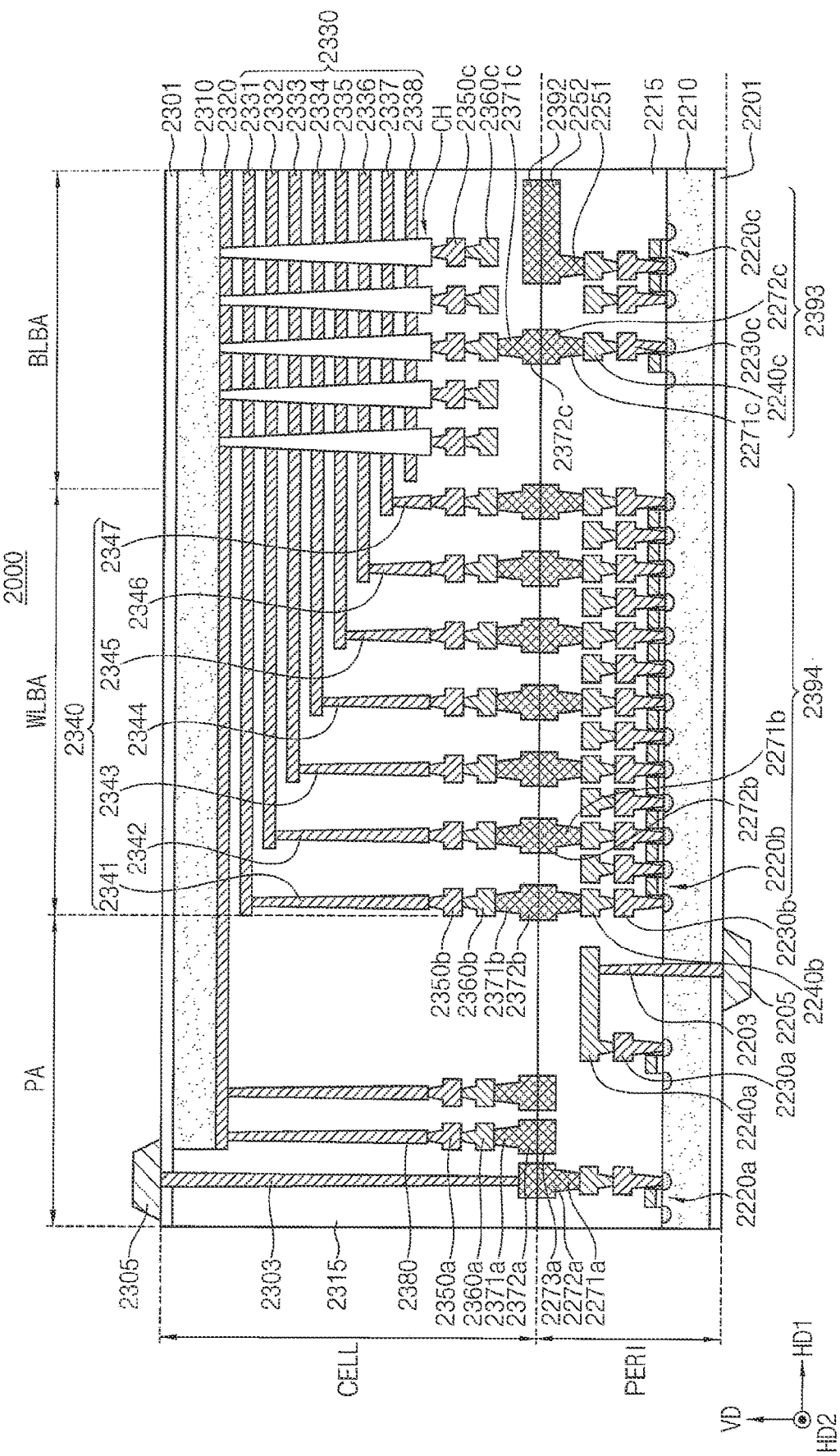
FIG. 31 is a cross-sectional view of a nonvolatile memory device according to example embodiments.

FIG. 31 is a cross-sectional view of a nonvolatile memory device according to example embodiments.

Referring to FIG. 31, a nonvolatile memory device 2000, which may be referred to as a memory device, may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip (as viewed from an inverted aspect) and a bonding metal formed on an uppermost metal layer of the lower chip. For example, the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having a relatively high electrical resistivity, and the second metal layers 2240a, 2240b, and 2240c may be formed of copper having a relatively low electrical resistivity.

In an example embodiment illustrated in FIG. 31, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred to as first metal pads and the lower bonding metals 2271b and 2272b in the peripheral circuit region PERI may be referred to as second metal pads.

The cell region CELL may include at least one memory block. The least one memory block may include a first region and a second region. The first region may store a compensation data set and may correspond to an SLC block. The cell region CELL may include a second substrate 2310 and a common source line 2320. On the second substrate 2310, a plurality of word-lines 2330, which may include word-line 2331, word-line 2332, word-line 2333, word-line 2334, word-line 2335, word-line 2336, word-line 2337, and word-line 2338 may be stacked in a vertical direction VD (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer and the like, and the channel layer may be electrically connected to a first metal layer and a second metal layer. For example, the first metal layer may be a bit-line contact 2350c and the second metal layer may be a bit-line 2360c. In an example embodiment, the bit-line 2360c may extend in a second horizontal direction HD2 (e.g., a Y-axis direction), parallel to the upper surface of the second substrate 2310.

In an example embodiment illustrated in FIG. 31, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer circuit 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer circuit 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2340, which may include cell contact plug 2341, cell contact plug 2342, cell contact plug 2343, cell contact plug 2344, cell contact plug 2345, cell contact plug 2346, and cell contact plug 2347. The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming an address decoder 2394 in the peripheral circuit region PERI. In an example embodiment, operating voltages of the circuit elements 2220b forming the address decoder 2394 may be different than operating voltages of the circuit elements 2220c forming the page buffer circuit 2393. For example, operating voltages of the circuit elements 2220c forming the page buffer circuit 2393 may be greater than operating voltages of the circuit elements 2220b forming the address decoder 2394.

A common source line contact plug 2380 may be disposed in the external pad bonding area PA. The common source line contact plug 2380 may be formed of a conductive material such as a metal, a metal compound, polysilicon, or the like and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203 and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to embodiments, the second substrate 2310 and the common source line 2320 may not be disposed in an area in which the second input/output contact plug 2303 is disposed. Also, the second input/output pad 2305 may not overlap the word-lines 2330 in the vertical direction HD. The second input/output contact plug 2303 may be separated from the second substrate 2310 in the direction parallel to the upper surface of the second substrate 2310 and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. In embodiments, the storage device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a corresponding to an upper metal pattern 2372a formed in an uppermost metal layer of the cell region CELL and having the same cross-sectional shape as the upper metal pattern 2372a of the cell region CELL so as to be connected to each other, in an uppermost metal layer of the peripheral circuit region PERI.

In the external pad bonding area PA, the memory device 2000 may include lower bonding metals 2271a and 2272a connected to the lower metal pattern 2273a. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a corresponding to the lower metal pattern 2273a formed in an uppermost metal layer of the peripheral circuit region PERI and having the same shape as a lower metal pattern 2273a of the peripheral circuit region PERI may be formed in an uppermost metal layer of the cell region CELL. Similarly, in the external pad bonding area PA, an upper bonding metal 2371a may be formed and may be electrically connected to the upper metal pattern 2372a.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392 corresponding to a lower metal pattern 2252 formed in the uppermost metal layer of the peripheral circuit region PERI and having the same cross-sectional shape as the lower metal pattern 2252 of the peripheral circuit region PERI may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL.

Figure 32:
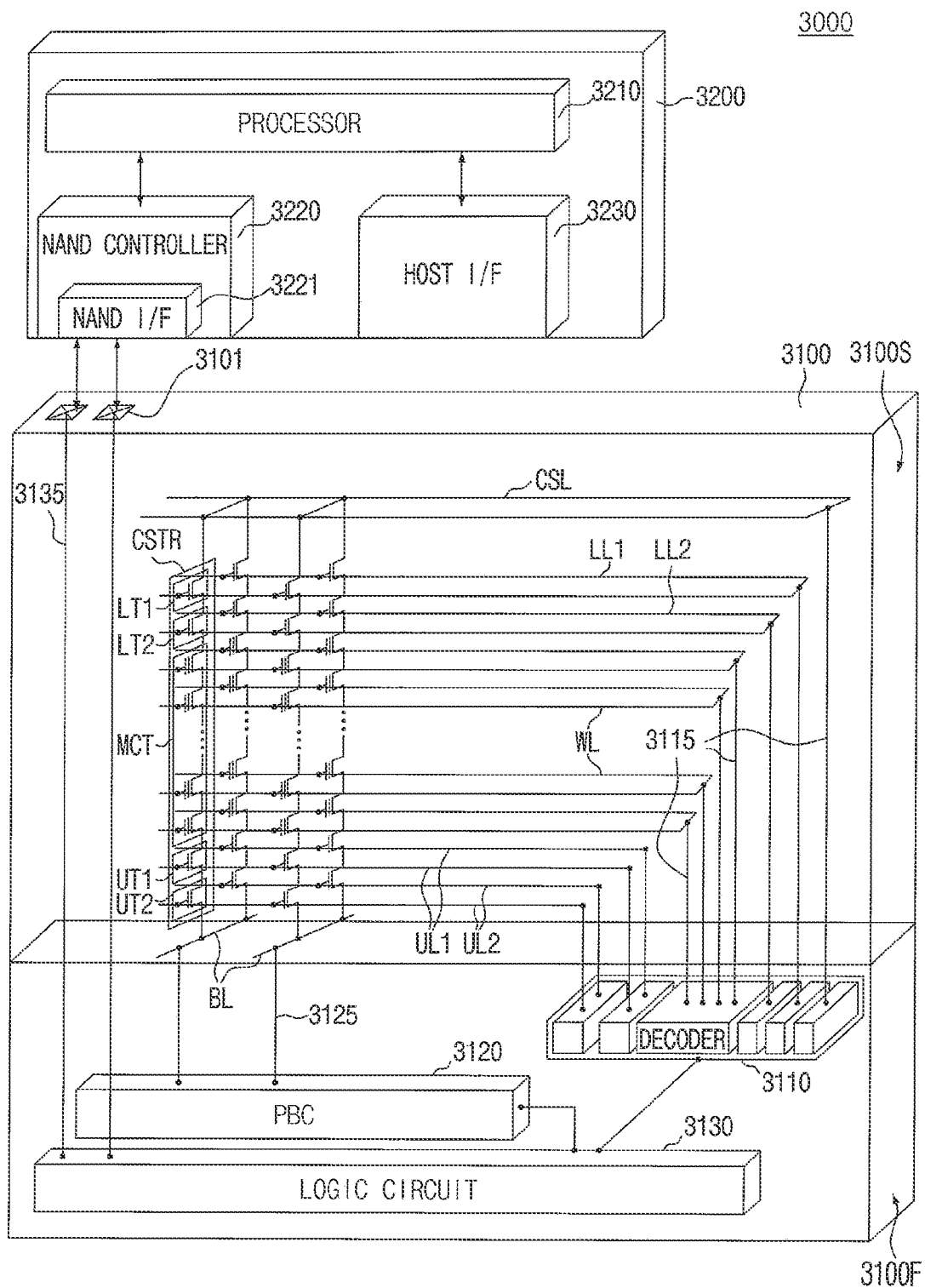
FIG. 32 is a block diagram illustrating an electronic system including a semiconductor device according to example embodiments.

FIG. 32 is a block diagram illustrating an electronic system including a semiconductor device according to example embodiments.

Referring to FIG. 32, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a nonvolatile memory device, for example, a nonvolatile memory device that is illustrated with reference to FIGS. 6 through 15 and 18 through 27. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2 (as viewed from an inverted aspect), first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in series. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 3115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware and may control the NAND controller 3220 to access the semiconductor device 3100. The NAND controller 3220 may include a NAND interface 3221 for communicating with the semiconductor device 3100. Through the NAND interface 3221, a control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to example embodiments may be packaged using various package types or package configurations.

The example embodiments may be applied to various electronic devices including a nonvolatile memory device. For example, the example embodiments may be applied to systems such as be a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the example embodiments as defined in the claims.

What is claimed is:

1. A nonvolatile memory device comprising:
   at least one memory block including a plurality of cell strings where each of the plurality of cell strings includes a string selection transistor, a plurality of memory cells and a ground selection transistor which are connected in series and disposed in a vertical direction between a source line and a bit-line, the plurality of cell strings being divided into a plurality of stacks disposed in the vertical direction, each of the plurality of stacks including at least one dummy word-line adjacent to a boundary between the plurality of stacks; and
   a control circuit configured to control a program operation by:
      applying a program voltage to a selected word-line of the plurality of cell strings during a program execution period; and
      reducing a voltage level of a dummy voltage applied to the at least one dummy word-line of at least one upper stack from among the plurality of stacks during the program execution period, wherein:
   the at least one upper stack is disposed at a higher position than a selected stack in the vertical direction, and
   the selected stack from among the plurality of stacks includes the selected word-line.

2. The nonvolatile memory device of claim 1, further comprising:
   a voltage generator configured to generate word-line voltages including the program voltage and the dummy voltage based on a control signal; and
   an address decoder configured to provide the word-line voltages to the at least one memory block based on a row address, wherein
   the control circuit is configured to control the voltage generator and the address decoder based on a command and an address including the row address.

3. The nonvolatile memory device of claim 2, wherein the control circuit is configured to control the voltage generator and the address decoder to:
   apply a first dummy voltage to the at least one dummy word-line of the least one upper stack during a first sub period of the program execution period;
   reduce the first dummy voltage to a second dummy voltage during a second sub period of the program execution period;
   apply a first pass voltage to word-lines of the at least one upper stack during the first sub period and the second sub period; and
   apply the second dummy voltage to the at least one dummy word-line of the least one upper stack during a third sub period of the program execution period.

4. The nonvolatile memory device of claim 3, wherein:
   the control circuit is configured to control the voltage generator and the address decoder to apply a second pass voltage smaller than the first pass voltage to the word-lines of the at least one upper stack during the third sub period, and
   a voltage level of the second pass voltage is greater than a ground voltage.

5. The nonvolatile memory device of claim 3, wherein:
   the control circuit is configured to control the voltage generator and the address decoder to:
      apply a second pass voltage smaller than the first pass voltage to second word-lines except a first word-line adjacent to the at least one dummy word-line, from among the word-lines of the at least one upper stack during the third sub period; and
      apply a third pass voltage smaller than the second pass voltage to the first word-line during the third sub period, wherein
   a voltage level of the second pass voltage is greater than a ground voltage.

6. The nonvolatile memory device of claim 3, wherein the control circuit is configured to control the voltage generator and the address decoder to apply the first pass voltage to unselected word-lines of the selected stack during the program execution period.

7. The nonvolatile memory device of claim 3, wherein:
dummy memory cells coupled to the at least one dummy word-line are turned on in response to the first dummy voltage; and
the dummy memory cells coupled to the at least one dummy word-line are turned off in response to the second dummy voltage.

8. The nonvolatile memory device of claim 3, wherein:
a voltage level of the first dummy voltage is greater than a ground voltage; and
the second dummy voltage has a level of the ground voltage or a level greater than the ground voltage and smaller than the first dummy voltage.

9. The nonvolatile memory device of claim of 2, wherein:
the plurality of stacks further include at least one lower stack disposed at a lower position than the selected stack in the vertical direction, and
the control circuit is configured to control the voltage generator and the address decoder to:
apply a first dummy voltage to the at least one dummy word-line of the least one upper stack during a first sub period of the program execution period;
reduce the first dummy voltage to a second dummy voltage during a second sub period of the program execution period;
apply a first pass voltage to word-lines of the at least one upper stack during the first sub period and the second sub period; and
apply the second dummy voltage to the at least one dummy word-line of the least one upper stack during a third sub period of the program execution period.

10. The nonvolatile memory device of claim of 9, wherein:
the control circuit is configured to control the voltage generator and the address decoder to:
apply a second pass voltage smaller than the first pass voltage to word-lines of the at least one upper stack during the third sub period; and
apply the first pass voltage to word-lines of the at least one lower stack during the program execution period, and
a voltage level of the second pass voltage is greater than a ground voltage.

11. The nonvolatile memory device of claim 9, wherein:
the control circuit is configured to control the voltage generator and the address decoder to:
apply a second pass voltage smaller than the first pass voltage to second word-lines except a first word-line adjacent to the at least one dummy word-line, from among the word-lines of the at least one upper stack during the third sub period;
apply a third pass voltage smaller than the second pass voltage to the first word-line during the third sub period; and
apply the first pass voltage to word-lines of the at least one lower stack during the program execution period, and
a voltage level of the second pass voltage is greater than a ground voltage.

12. The nonvolatile memory device of claim 9, wherein the control circuit is configured to control the voltage generator and the address decoder to:
apply the first pass voltage to unselected word-lines of the selected stack during the program execution period; and
apply the first pass voltage to word-lines of the at least one lower stack during the program execution period.

13. The nonvolatile memory device of claim 9, wherein the control circuit is configured to control the voltage generator and the address decoder to apply the first dummy voltage to the at least one dummy word-line of the selected stack during the program execution period.

14. The nonvolatile memory device of claim 1, wherein dummy memory cells coupled to the at least one dummy word-line does not include valid data or include single-bit data.

15. The nonvolatile memory device of claim 1, further comprising:
a memory cell region including the at least one memory block and a first metal pad; and
a peripheral circuit region including the control circuit and a second metal pad, the peripheral circuit region being connected to the memory cell region through the second metal pad and the first metal pad, wherein:
the peripheral circuit region further includes:
a voltage generator configured to generate word-line voltages including the program voltage and the dummy voltage based on a control signal; and
an address decoder configured to provide the word-line voltages to the at least one memory block based on a row address, and
the address decoder is configured to apply the program voltage and the dummy voltage to the at least one memory cell region through the second metal pad and the first metal pad.

16. The nonvolatile memory device of claim 1, further comprising:
a voltage generator configured to generate word-line voltages including the program voltage and the dummy voltage based on a control signal; and
an address decoder configured to provide the word-line voltages to the at least one memory block based on a row address, wherein:
the at least one memory block is disposed in a first semiconductor layer,
the control circuit, the voltage generator and the address decoder are disposed in a second semiconductor layer, and
the first semiconductor layer and the second semiconductor layer are disposed in the vertical direction.

17. A programming method of a nonvolatile memory device, the programming method comprising:
dividing a plurality of cell strings in at least one memory block into a plurality of stacks disposed in a vertical direction, wherein each of the plurality of cell strings includes a string selection transistor, a plurality of memory cells and a ground selection transistor which are connected in series and disposed in the vertical direction between a source line and a bit-line, each of the plurality of stacks including at least one dummy word-line adjacent to a boundary between the plurality of stacks;
applying a program voltage to a selected word-line of the plurality of cell strings during a program execution period; and
reducing a voltage level of a dummy voltage applied to the at least one dummy word-line of at least one upper stack from among the plurality of stacks during the program execution period, wherein:

the at least one upper stack is disposed at a higher position than a selected stack in the vertical direction, and the selected stack from among the plurality of stacks includes the selected word-line.

18. The programming method of claim 17, wherein reducing the voltage level of the dummy voltage during the program execution period includes:

applying a first dummy voltage to the at least one dummy word-line of the least one upper stack during a first sub period of the program execution period;

reducing the first dummy voltage to a second dummy voltage during a second sub period of the program execution period;

applying a first pass voltage to word-lines of the at least one upper stack during the first sub period and the second sub period; and applying the second dummy voltage to the at least one dummy word-line of the least one upper stack during a third sub period of the program execution period.

19. A nonvolatile memory device comprising:

at least one memory block including a plurality of cell strings where each of the plurality of cell strings includes a string selection transistor, a plurality of memory cells and a ground selection transistor which are connected in series and disposed in a vertical direction between a source line and a bit-line, the plurality of cell strings being divided into a plurality of sub-blocks disposed in the vertical direction, each of the plurality of sub-blocks including at least one boundary word-line adjacent to other sub-block and internal word-lines except the at least one boundary word-line; and a control circuit configured to control a program operation by:

applying a program voltage to a selected word-line of the plurality of cell strings during a program execution period; and reducing a voltage level of a dummy voltage applied to the at least one boundary word-line of at least one upper sub-block from among the plurality of sub-blocks during the program execution period, wherein:

the at least one upper sub-block is disposed at a higher position than a selected sub-block in the vertical direction, and the selected sub-block from among the plurality of sub-blocks includes the selected word-line.

20. The nonvolatile memory device of claim 19, further comprising:

a voltage generator configured to generate word-line voltages including the program voltage and the dummy voltage based on a control signal; and an address decoder configured to provide the word-line voltages to the at least one memory block based on a row address, wherein:

the control circuit is configured to control the voltage generator and the address decoder, based on a command and an address including the row address, to:

apply a first dummy voltage to the at least one boundary word-line of the least one upper sub-block during a first sub period of the program execution period;

reduce the first dummy voltage to a second dummy voltage during a second sub period of the program execution period;

apply a first pass voltage to the internal word-lines of the at least one upper sub-block during the first sub period and the second sub period; and apply the second dummy voltage to the at least one boundary word-line of the least one upper sub-block during a third sub period of the program execution period.

* * * * *